United States Patent
Fudge et al.

(10) Patent No.: US 7,436,911 B2
(45) Date of Patent: Oct. 14, 2008

(54) NYQUIST FOLDED BANDPASS SAMPLING RECEIVERS WITH NARROW BAND FILTERS FOR UWB PULSES AND RELATED METHODS

(75) Inventors: Gerald L. Fudge, Rockwall, TX (US);
James E. Harvey, Heath, TX (US);
Mark A. Chivers, McKinney, TX (US);
Sujit Ravindran, Dallas, TX (US)

(73) Assignee: L-3 Communications Integrated Systems L.P., Greenville, TX (US)

( * ) Notice: Subject to any disclaimer, the term of this patent is extended or adjusted under 35 U.S.C. 154(b) by 204 days.

(21) Appl. No.: 11/545,641

(22) Filed: Oct. 10, 2006

(65) Prior Publication Data

US 2007/0081578 A1    Apr. 12, 2007

Related U.S. Application Data

(63) Continuation-in-part of application No. 11/247,338, filed on Oct. 11, 2005, and a continuation-in-part of application No. 11/247,314, filed on Oct. 11, 2005.

(51) Int. Cl.
  *H03D 1/00*    (2006.01)
(52) U.S. Cl. .......................................... 375/340
(58) Field of Classification Search ................ 375/316, 375/340, 354, 355
  See application file for complete search history.

(56) References Cited

U.S. PATENT DOCUMENTS

| | | | |
|---|---|---|---|
| 5,014,018 A | 5/1991 | Rodwell et al. | 333/20 |
| 5,454,007 A | 9/1995 | Dutta | 375/78 |
| 6,266,518 B1 | 7/2001 | Sorrells et al. | 455/118 |
| 6,507,624 B1 | 1/2003 | Jachim et al. | 375/316 |
| 6,574,459 B1 | 6/2003 | Kaminski et al. | 455/272 |
| 6,700,388 B1 | 3/2004 | Mayor et al. | 324/537 |
| 6,900,710 B2 | 5/2005 | Agoston et al. | 333/248 |
| 7,107,033 B2 | 9/2006 | du Toit | 455/296 |
| 2002/0161300 A1 | 10/2002 | Hoff et al. | 600/449 |
| 2003/0016762 A1 | 1/2003 | Martin et al. | 375/308 |
| 2003/0054783 A1 | 3/2003 | Mason et al. | 455/307 |
| 2005/0069046 A1 | 3/2005 | Tsui et al. | 375/260 |

OTHER PUBLICATIONS

Arthur, "Modern SAW-based pulse compression systems for radar applications, Part I: SAW matched filters," Electronics & Communication Engineering Journal, Dec. 1995, pp. 236-246.

Arthur, "Modern SAW-based pulse compression systems for radar applications, Part II: Practical systems," Electronics & Communication Engineering Journal, Apr. 1996, pp. 57-78.

Brandl et al., "High Speed Signal Processing with Tapped Dispersive SAW based Delay Lines," University of Technology, Applied Electronics Laboratory, Vienna Austria, IEEE 2000, pp. 171-176.

(Continued)

*Primary Examiner*—David B Lugo
(74) *Attorney, Agent, or Firm*—O'Keefe, Egan, Peterman & Enders, LLP

(57) ABSTRACT

Nyquist folded bandpass sampling receivers are disclosed that utilize narrow band filters in parallel with wideband filters to enhance reception of ultra wideband (UWB) pulses. The addition of the narrow band filter facilitates the reception of ultra wideband signal pulses and, therefore, extends the Nyquist folding bandpass sampling receiver to allow improved processing of ultra wideband (UWB) pulses. RF sampling circuitry utilizing a modulated sampling clock signal can then better capture UWB pulse signals.

21 Claims, 9 Drawing Sheets

OTHER PUBLICATIONS

Burke, "Ultra-Linear Chirp Generation Via VCO Tuning Predistortion," AIL Systems, Inc., Deer Park, New York, IEEE 1994 MTT-S Digest, pp. 957-960.

Gerard et al., "The Design and Applications of Highly Dispersive Acoustic Surface-Wave Filters," Invited Paper, IEEE Transactions on Microwave Theory and Techniques, vol. MTT-21, No. 4, Apr. 1973, pp. 176-186.

Ong et al., "Digital LPI Radar Detector," Naval Postgraduate School Thesis, Monterey, California, Mar. 2001, pp. 1-81.

Grant et al., "Recent Advances in Analog Signal Processing," IEEE 1990, IEEE Transactions on Aerospace and Electronic Systems, vol. 26, No. 5, Sep. 1990, pp. 818-849.

Li et al, "On the Use of a Compressive Receiver for Signal Detection," IEEE 1991, IEEE Transactions on Communications, vol. 39, No. 4, Apr. 1991, pp. 557-566.

Levy et al, "VCO Based Chirp Generation for Broad Bandwidth Compressive Receiver Applications," AIL Systems, Inc., Deer Park, New York, IEEE 1993 MTT-S Digest, pp. 1113-1115.

Lucyszyn, "Review of radio frequency microelectromechanical systems technology," Imperial College, London, IEE Proc.-Sci. Meas. Technol.vol. 151, No. 2, Mar. 2004, pp. 93-103.

Lyons et al., "High Temperature Superconductive Wideband Compressive Receivers," Analog Device Technology Group, Lincoln Laboratory, Invited Paper, IEEE Transactions on Microwave Theory and Techniques, vol. 44, No. 7, Jul. 1996, pp. 1258-1278.

Unser, "Sampling—50 Years After Shannon," Swiss Federal Institute of Technology, Lausanne, Switzerland, IEEE 2000 Proceedings of the IEEE, vol. 88, No. 4, Apr. 2000, pp. 569-587.

Sengupta et al, "Novel Ferroelectric Materials for Phased Array Antennas," U.S. Army Research Laboratory, Aberdeen Proving Groud, 1997 IEEE, IEEE Transactions Ultrasonics, Ferroelectrics, and Frequency Control, vol. 44, No. 4, Jul. 1997, pp. 792-797.

Serhan et al., "Automatic Frequency Control Techniques For Microwave Active Filters," Limoges University, Limoges, France, 1997 IEEE MTT -S Digest, pp. 697-700.

Whittaker et al, "Digital chirp filter processing for improved performance of sweeping spectrum analysers," University of Surrey, Surrey, UK, Electronics Letters, Aug. 3, 2000, vol. 36, No. 16, pp. 1430-1432.

Agoston et al, "100 GHz Through-Line Sampler System with Sampling Rates in Excess of 10 G samples/second," Picosecond Pulse Labs, Boulder, Colorado, PSPL -100 Sample Paper—Submitted to MTT 2003, http://www.picosecond.com->products->sampler modules, 3 pgs.

Akbari-Dilmaghani et al, "A High Q RF CMOS Differential Active Inductor," Imperial College, London, 1998 IEEE International Conference on Electronics, Circuits and Systems, vol. 3, Sep. 7-10, 1998, pp. 157-160.

Akos et al, "Direct Bandpass Sampling of Multiple Distinct RF Signals," 1999 IEEE Transactions on Communications, Vo. 47, No. 7, Jul. 1999, pp. 983-988.

Behbahani et al, "A Broad-Band Tunable CMOS Channel-Select Filter for a Low-IF Wireless Receiver," 2000 IEEE Journal of Solid-State Circuits, vol. 35, No. 4, Apr. 2000, pp. 476-489.

Brown et al, "Digital L-Band Receiver Architecture with Direct RF Sampling," NAVSYS Corp., Colorado Springs, Colorado, Position Location and Navigation Symposium, 1994, IEEE, Apr. 11-15, 1994, pp. 209-216.

Copeland et al, "5-GHz SiGe HBT Monolithic Radio Transceiver with Tunable Filtering," 2000 IEEE Transactions on Microwave Theory and Techniques, vol. 48, No. 2, Feb. 2000, pp. 170-181.

Deleniv et al, "Tunable Ferroelectric Filter-Phase Shifter," University of Technology, Gothenburg, Sweden, 2003 IEEE MTT-S Digest, pp. 1267-1270.

Juodawlkis et al, "Optical Down-Sampling of Wide-Band Microwave Signals," Invited Paper, Journal of Lightwave Technology, vol. 21, No. 12, Dec. 2003, pp. 3116-3124.

Karvonen et al, "A CMOS Quadrature Charge-Domain Sampling Circuit with 66-dB SFDR Up to 100 MHz," 2005 IEEE Transactions on Circuits and Systems -I: Regular Papers, vol. 52, No. 2, Feb. 2005, pp. 292-304.

Koc et al, "Direct RF Sampling Continuous-Time Bandpass /spl Delta/-/spl Sigma/A/D Converter Design for 3G Wireless Applications," ISCAS 2004, May 23-26, 2004, vol. 1, pp. 409-412.

Latiri et al, "A reconfigurable RF sampling receiver for multistandard applications," Comptes Rendus Physique 7 (2006), pp. 785-793.

Lindfors et al, "A 3-V 230- MHz CMOS Decimation Subsampler," 2003 IEEE Transactions on Circuits and Systems—II: Analog and Digital Signal Processing, vol. 50. No. 3, Mar. 2003, pp. 105-117.

Loper, "A Tri-Phase Direct Conversion Receiver," Rockwell International, MILCOM 1990, Sep. 30-Oct. 3, 1990, pp. 1228-1232.

Luy et al, "Configurable RF Receiver Architecture," Daimler-Chrysler Research and Tecnology, Ulm, Germany, 2004 IEEE Microwave Magazine, Mar. 2004, pp. 75-82.

Minnis et al, "A Highly Digitized Multimode Receiver Architecture for 3G Mobiles," 2003 IEEE Transactions on Vehicular Technology, vol. 52, No. 3, May 2003, pp. 637-653.

Mirabbasi et al, "Classical and Modern Receiver Architectures," University of Toronto, 2000 IEEE Communications Magazine, Nov. 2000, pp. 132-139.

Mostafa et al, " WCDMA Receiver Architecture with Unique Frequency Plan," Micro Lnear Corp. San Jose, California and Texas Instruments, Inc., Dallas, Texas, ASIC/SOC Conference, 2001 Proceedings, 14th Annual IEEE International, Sep. 12-15, 2001, pp. 57-61.

Muhammad et al, "Direct RF Sampling Mixer With Recursive Filtering in Charge Domain," Texas Instruments Incorporated, Dallas, Texas, ISCAS, May 23-26, 2004, vol. 1, pp. 577-580.

Namgoong et al., "Direct-Conversion RF Receiver Design," 2001 IEEE Transactions on Communications, vol. 49, No. 3, Mar. 2001, pp. 518-529.

Pellon, "RF-to-Digital Receivers Employing Bandpass Multibit /spl Sigma//spl Delta/ ADC Architectures," Lockheed Martin Government Electronic Systems, Morristown, New Jersey, 20th Annual Gallium Arsenide Integrated Circuit (GaAs IC) Symposium, Nov. 1-4, 1998, pp. 11-14.

"Real-Time Sampling Downconverter Front Ends for Digital Radar and Wide-Bank Signaling," Picoscond Pulse Labs, 2500 55th Street, Boulder, CO 80301, (Nov. 2004).

Richter et al, "An Integrated Wideband-IF-Receiver Architecture for Mobile Terminals," Dresden University of Technology, Dresden, Germany, 2003 IEEE Radio Frequency Integrated Circuits Symposium, Jun. 8-10, 2003, pp. 583-586.

Shoji et al, "70-GHz-Band MMIC Transceiver With Integrated Antenna Diversity System: Application of Receive-Module-Arrayed Self-Heterodyne Technique," 2004 IEEE Transactions on Microwave Theory and Techniques, vol. 52, No. 11, Nov. 2004, pp. 2541-2549.

Springer et al, " RF System Concepts for Highly Integrated RFICs for W-CDMA Mobile Radio Terminals," 2002 IEEE Transactions on Microwave Theory and Techniques, vol. 50, No. 1, Jan. 2002, pp. 254-267.

Tatu et al, "Ka-Band Direct Digital Receiver," 2002 IEEE Transactions on Microwave Theory and Techniques, vol. 50, No. 11, Nov. 2002, pp. 2436-2442.

Tayebati et al, "Microelectromechanical tuneable filters with 0.47 nm linewidth and 70nm tuning rage," Electronics Letters, Jan. 8, 1998, vol. 34, No. 1, pp. 76-78.

Thor et al, "A Direct RF Sampling Multifrequency GPS Receiver," Stanford University, Position Location and Navigation Symposium, 2002 IEEE, Apr. 15-18, 2002, pp. 44-51.

Tsui et al, "Digital Microwave Receiver Technology," Invited Paper, 2002 IEEE Transactions on Mircowave Theory and Techniques, vol. 50, No. 3, Mar. 2002, pp. 699-705.

Valkama et al., "Advanced Receiver Architectures and I/Q Signal Processing," Tampere University of Technology, Tampere, Finland, First International Symposium on Control, Communications and Signal Processing, IEEE Jun. 2004, pp. 71-74.

Vaughan et al, "The Theory of Bandpass Sampling," 1991 IEEE Transactions on Signal Processing, vol. 39, No. 9, Sep. 1991, pp. 1973-1984.

Wooten et al, "Rapidly Tunable Narrowband Wavelength Filter Using LiNbO3 Unbalanced Mach-Zehnder Interferometers," Journal of Lightwave Technology, vol. 14, No. 11, Nov. 1996, pp. 2530-2536.

Pepper et al, "NLTLs Push Sampler Products Past 100 GHz," Microwaves & RF, Oct. 2005, 6 pgs.

Model 7620 DCSM VME Card Datasheet, Revision C, Picosecond Pulse Labs, Boulder, Colorado, Sep. 2005, 10 pgs.

Wepman, "Analog -to- Digital Converters and Their Applications in Radio Receivers," 1995 IEEE Communications Magazine, May 1995, pp. 39-45.

U.S. Appl. No. 60/373,163, filed Apr. 17, 2002, "Tunable modules for frequency agile receivers."

Brueller et al, "On Non-uniform Sampling of Signals," Israel Institute of Technology, Haifa, Israel, ISIE, Jul. 7-10, 1998, pp. 249-252.

Candes et al, "Robust Uncertainty Principles: Exact Signal Reconstruction From Highly Incomplete Frequency Information," 2006 IEEE Transactions on Information Theory, Vo. 52, No. 2, Feb. 2006, pp. 489-509.

Donoho, "Compressed Sensing," 2006 IEEE Transactions on Information Theory, vol. 52, No. 4., Apr. 2006, pp. 1289-1306.

Dragotti et al, "Exact Sampling Results for Signals with Finite Rate of Innovation Using Strang-Fix Conditions and Local Kernels," ICASSP 2005, Mar. 18-23, 2005, pp. 233-236.

Dragotti et al, "Wavelet Footprints: Theory, Algorithms, and Applications," 2003 IEEE Transactions on Signal Processing, vol. 51, No. 5, May 2003, pp. 1306-1323.

Duarte et al, "Distributed Compressed Sensing of Jointly Sparse Signals," Rice University, Houston, Texas, Asilomar Conference on Signals, Systems and Computers 2005, Oct. 28-Nov. 1, 2005, pp. 1537-1541.

Gansman et al, "Single Frequency Estimation with Non-uniform Sampling," Asilomar Conference on Signals, Systems and Computers 1996, Nov. 3-6, 1996, vol. 1., pp. 399-403.

Herley et al, "Minimum Rate Sampling and Reconstruction of Signals with Arbitrary Frequency Support," 1999 IEEE Transactions on Information Theory, vol. 45, No. 5, Jul. 1999, pp. 1555-1564.

Kumar et al, "On Distributed Sampling of Bandlimited and Non-Bandlimited Sensor Fields," University of California, Berkeley, California, ICASSP 2004, May 17-21, 2004 vol. III., pp. 925-928.

Lefkaditis et al., Ambiguities in the harmonic retrieval problem using non-uniform sampling, IEE Proceedings—Radar, Sonar and Navigation, Dec. 2001, pp. 325-329.

Maravic et al, "Channel Estimation and Synchronization with Sub-Nyquist Sampling and Application to Ultra-Wideband Systems," ISCAS 2004, May 23-26, 2004, pp. V-381-V-384.

Maravic et al, "Sampling and Reconstruction of Signals With Finite Rate of Innovation in the Presence of Noise," 2005 IEEE Transactions on Signal Processing, vol. 53, No. 8, Aug. 2005, pp. 2788-2805.

Pace et al, "Use of the Symmetrical Number System in Resolving Single-Frequency Undersampling Aliases," 1997 IEEE Transactions on Signal Processing, vol. 45, No. 5, May 1997, pp. 1153-1160.

Sanderson et al, "Reduction of Aliasing Ambiguities Through Phase Relations," 1992 IEEE Transactions on Aerospace and Electronic Systems, vol. 28, No. 4, Oct. 1992, pp. 950-956.

Sayiner et al, "A Non-Uniform Sampling Technique For A/D Conversion," ISCAS 193, May 3-6, 1993, pp. 1220-1223.

Styer et al, "Two Channel RSNS Dynamic Range," 2002 IEEE Transactions on Circuits and Systems—I: Fundamental Theory and Applications, vol. 49, No. 3., Mar. 2002, pp. 395-397.

Vetterli et al, "Sampling Signals With Finite Rate of Innovation," 2002 IEEE Transactions on Signal Processing, vol. 50, No. 6, Jun. 2002, pp. 1417-1428.

Walter, "Non-Uniform Sampling in Wavelet Subspaces," University of Wisconsin, Milwaukee, Wisconsin, ICASSP 1999, pp. 2057-2059.

Xia, "An Efficient Frequency-Determination Algorithm from Multiple Undersampled Waveforms," 2000 IEEE Transactions on Signal Processing Letters, vol. 7, No. 2, Feb. 2000, pp. 34-37.

Xiong et al, "A Non-uniform Sampling Tangent Type FM Demodulation," 2004 IEEE Transactions on Consumer Electronics, vol. 50, No. 3., Aug. 2004, pp. 844-848.

Zhu et al, "Adaptive Non-Uniform Sampling Delta Modulation For Audio/Image Processing," 1996 IEEE Transactions on Consumer Electronics, vol. 42, No. 4, Nov. 1996, pp. 1062-1072.

PCT International Search Report, PCT/US2006/039615, Apr. 2, 2007.

PCT International Application No. PCT/US06/39506, "*International Search Report*," filed Oct. 10, 2006.

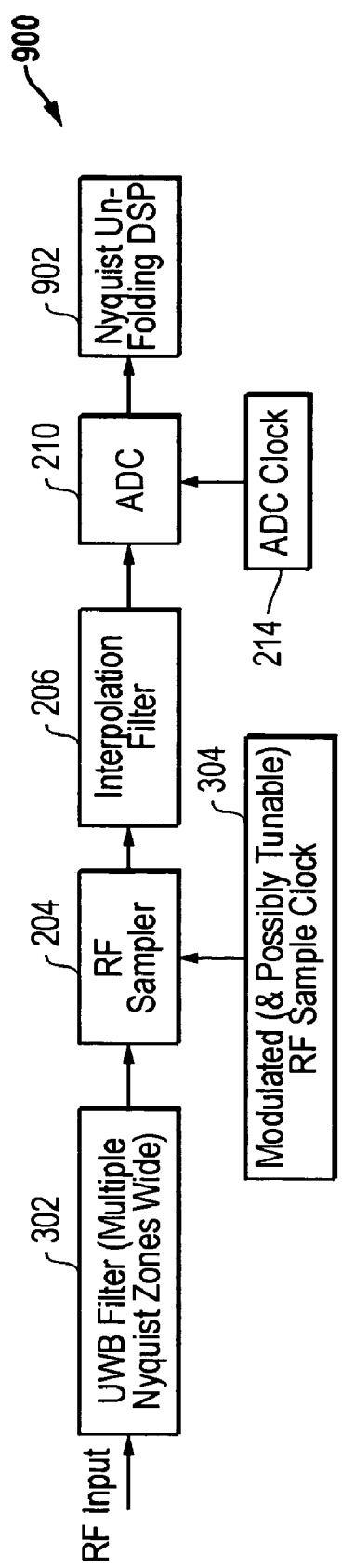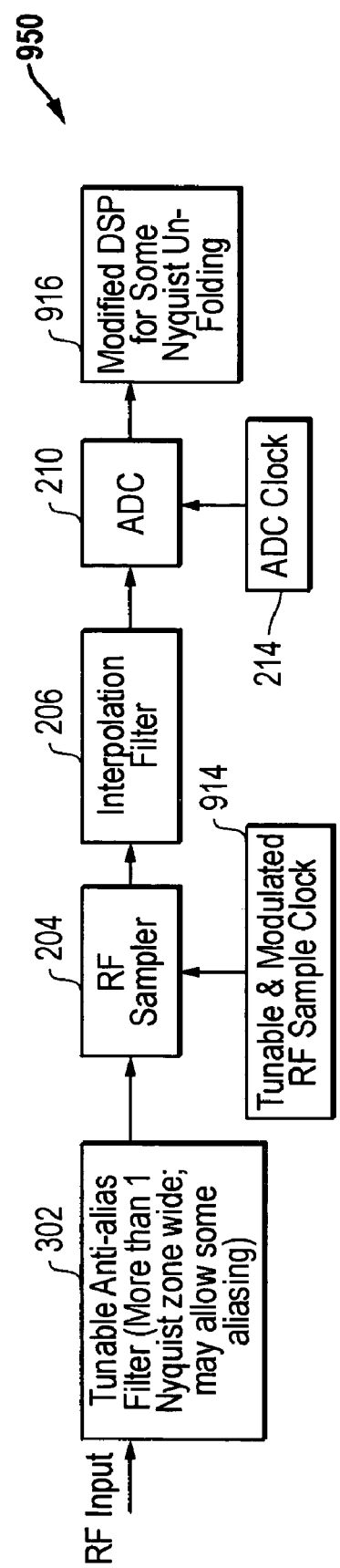
FIG. 9A
FIG. 9B

NYQUIST FOLDED BANDPASS SAMPLING RECEIVERS WITH NARROW BAND FILTERS FOR UWB PULSES AND RELATED METHODS

RELATED APPLICATIONS

This application is a continuation-in-part application of the following two co-pending applications: U.S. patent application Ser. No. 11/247,338 entitled "RECONFIGURABLE DIRECT RF BANDPASS SAMPLING RECEIVER AND RELATED METHODS," which was filed on Oct. 11, 2005, and U.S. patent application Ser. No. 11/247,314 entitled "SWEPT BANDPASS FILTER FREQUENCY MODULATED CONTINUOUS WAVE (FMCW) RECEIVER AND RELATED METHODS," which was filed on Oct. 11, 2005, the entire text and all contents for each of which is hereby expressly incorporated by reference in its entirety.

This application is also related in part to the subject matter described in the following concurrently filed patent applications: U.S. patent application Ser. No. 11/545,310, entitled "DIRECT BANDPASS SAMPLING RECEIVERS WITH ANALOG INTERPOLATION FILTERS AND RELATED METHODS," and U.S. patent application Ser. No. 11/545,642, entitled "NYQUIST FOLDED BANDPASS SAMPLING RECEIVERS AND RELATED METHODS," the entire text and all contents for each of which is hereby expressly incorporated by reference in its entirety.

TECHNICAL FIELD OF THE INVENTION

This invention relates to receiver architectures for the efficient sampling of radio frequency (RF) signals and, more particularly, to receiver architectures for the efficient sampling of signals over a wide frequency range of interest.

BACKGROUND

A wide variety of signals and related protocols exist for the use of radio frequency (RF) signals in communication systems and other devices, such as radar systems. In some applications, it is desirable to determine or confirm the existence of RF signals and accurately measure their parameters. RF signals of interest, however, can occur across a wide range of center frequencies with various bandwidths and can have relatively small signals compared to background noise. As such, it is desirable for an RF receiver to be designed to acquire and allow the detection and measurement of signals across a wide frequency range with various bandwidths while contributing little distortion, spurs or interference from its own circuitry. For a electronic intelligence application, for example, the desired signals to be acquired and detected can fall within a frequency range from less than 2 GHz to greater then 20 GHz. To provide reasonable sensitivity against a variety of signal types and bandwidths while maximizing search coverage, typical instantaneous search bandwidths may range from 100 MHz or less to 1 GHz or greater.

Many receiver architectures currently exist for receiving and detecting RF signals. These architectures include heterodyne receivers, homodyne receivers (also called zero-IF and direct conversion receivers for intermediate frequency (IF) applications), low-IF receivers, double conversion wideband IF receivers, wideband digital receivers, 6-port receivers (a special case of homodyne receivers), 3-phase variations of homodyne receivers, charge-domain direct RF mixer-sampler receivers, compressive receivers, noise-shaping sigma-delta receivers, non-reconfigurable direct RF optical down-sampling receivers, bandpass sampling variations of heterodyne receivers, and optical tuned channelized filters for fiberoptic WDM (wavelength division multiplexed) receivers. In addition, multi-signal bandpass sampling receivers combining the outputs from multiple bandpass filters without tuning have been proposed. In addition, noise-shaping sigma delta converters that use a bank of bandpass filters to implement a tuning function with a modulation sampling clock meeting the Nyquist criteria for the total frequency range of interest have been designed. In addition, direct RF receivers based on the use of analog high-speed pre-samplers have been built, although not in any reconfigurable architecture. Still further, combination architectures have been utilized such as a combination of switched homodyne receiver and low-IF receiver architectures.

For wideband applications, sampling at the Nyquist rate of at least twice the bandwidth can be very difficult because of device limitations, power consumption, size, weight, and cost. In order to avoid these difficulties, sub-Nyquist sampling schemes have been proposed including various non-uniform sampling techniques for harmonic retrieval and some recent methods in compressive sensing (also referred to as compressive sampling). Non-uniform sampling techniques proposed to date have, however, been limited in the types of signals that can be processed (generally extremely narrow-band signals), number of simultaneous signals (one or two typically), and total decimation ratio (typically 1/5 to 1/10 Nyquist at best). Compressive sensing techniques suffer from numerous challenges, including device implementation, computational complexity, and signal reconstruction.

Each of these prior architectures suffer certain disadvantages and, therefore, have not been entirely effective in receiving and detecting RF signals, particularly in applications requiring reconfigurability for variable signal environment; the ability to reconstruct the signal; reasonable sensitivity; low size, weight, cost, and power; large frequency range of interest that may span many GHz; including applications such as radar warning receivers, electronic support receivers, electronic support measures receivers, electronic intelligence, communications intelligence, and ultra wideband radar receiver applications.

SUMMARY OF THE INVENTION

Nyquist folded bandpass sampling receivers are disclosed that utilize narrow band filters in parallel with wideband filters to enhance reception of ultra wideband (UWB) pulses. The addition of the narrow band filter facilitates the reception of ultra wideband signal pulses and, therefore, extends the Nyquist folding bandpass sampling receiver to allow improved processing of ultra wideband (UWB) pulses. RF sampling circuitry utilizing a modulated sampling clock signal can then better capture UWB pulse signals. As described in more detail below, a variety systems and methods can be utilized as part of the present invention.

In one embodiment, receive path circuitry is disclosed for a bandpass sampling receiver having folded Nyquist zones and ultra wideband pulse capabilities including wideband filter circuitry receiving an RF input signal that has a center frequency within a frequency range of interest and has a bandwidth less than or equal to the frequency range of interest and wide enough to cover multiple Nyquist zones associated with a modulated sampling clock, narrow band filter circuitry receiving the RF input signal and having a center frequency within a frequency range of interest and having a bandwidth less than the Nyquist bandwidth of the modulated sampling clock, and sampling circuitry configured to receive a filtered signal from the wideband filter circuitry, to receive a filtered signal from the narrow band filter circuitry, and to receive the modulated sampling clock signal as an input where the modulated sampling clock signal is configured to provide non-uniform sampling for signals within the multiple Nyquist zones. In addition, the modulated sampling clock signal can be a frequency modulated clock signal. In addition, the frequency modulated clock signal may include a linear sawtooth modulation, a sinusoidal modulation, a triangle modulation, a frequency shift key modulation, a frequency agile modulation, a communications frequency modulation, or a combination thereof.

In a further embodiment for the receive path circuitry, the sampling circuitry can include non-quantizing sampling circuitry, an analog interpolation filter coupled to receive the output of the non-quantizing sampling circuitry where the analog interpolation filter has a center frequency within a Nyquist zone of operation for the non-quantizing sampling circuitry, and analog to digital converter (ADC) circuitry configured to receive a quantization sampling clock signal and to quantize an analog signal received from the analog interpolation filter. In addition, the analog interpolation filter can include a tunable or switchable interpolation filter.

In a further embodiment, the modulated sampling clock can include a frequency modulated sampling clock having a tunable frequency or an adjustable modulation or both. Still further, the wideband filter circuitry can include a wideband filter having bandwidth of 10 GHz or more; the modulated sampling clock can have a sampling rate of 1 GHz or more; and the narrow band filter circuitry can have a bandwidth less than 1 GHz. In addition, the wideband filter circuitry can include a wideband filter having bandwidth of 20 GHz or more; the modulated sampling clock can have a sampling rate of 2 GHz or more; and the narrow band filter circuitry can have a bandwidth less than 2 GHz. Also, the wideband filter circuitry can be a tunable bandpass filter having a tunable center frequency dependent upon a filter control signal where the center frequency is tunable across the frequency range of interest and where the tunable bandpass filter has a bandwidth less than the frequency range of interest. The narrow band filter circuitry can include one or more tunable narrow band filters each having a tunable center frequency dependent upon a filter control signal and each being tunable across the frequency range of interest. And the receive path circuitry can further include digital signal processing circuitry coupled to receive an output from the sampling circuitry and configured to identify ultra wideband pulses based upon signals passed through the narrow band filter circuitry.

In another embodiment, a method is disclosed for bandpass sampling of signals using folded Nyquist zones including utilizing wideband filter circuitry to filter an RF input signal within a frequency range of interest where the bandpass filter has a bandwidth less than or equal to the frequency range of interest and wide enough to cover multiple Nyquist zones associated with a modulated sampling clock, also filtering the RF input signal with narrow band filter circuitry having a center frequency within a frequency range of interest and having a bandwidth less than the Nyquist bandwidth of the modulated sampling clock, combining an output signal from the wideband filter circuitry with an output signal from the narrow band filter circuitry to generate a combined filtered signal, generating a modulated sampling clock configured to provide non-uniform sampling for signals within the multiple Nyquist zones, and bandpass sampling the combined filtered signal from the wideband filter circuitry covering multiple Nyquist zones using the modulated sampling clock. In addition, the generating step can include generating a chirp frequency modulated clock signal for the modulated sampling clock signal.

In another embodiment for the method, the bandpass sampling step can include bandpass sampling the combined filtered signal without quantizing the signal, filtering the sampled signal with an analog interpolation filter having a center frequency within a Nyquist zone, and quantizing a signal received from the analog interpolation filter. In addition, the generating step can include generating a frequency modulated clock signal for the modulated sampling clock signal, and the method can include using a tunable or switchable interpolation filter as the analog interpolation filter. Still further, the utilizing step can include utilizing wideband filter circuitry having a bandwidth of 10 GHz or more, the generating step can include generating a modulated sampling clock signal having a sampling rate of 1 GHz or more, and the filtering step can include filtering with narrow band filter circuitry having a bandwidth less than 1 GHz. In addition, the utilizing step can include utilizing wideband filter circuitry having a bandwidth of 20 GHz or more, the generating step can include generating a modulated sampling clock signal having a sampling rate of 2 GHz or more, and the filtering step can include filtering with narrow band filter circuitry having a bandwidth less than 2 GHz.

In a further embodiment, the utilizing step can include utilizing one or more tunable bandpass filters and further comprising tuning the center frequency of the tunable bandpass filter within the frequency range of interest. In addition, the filtering step can include also filtering the RF input signal with one or more tunable narrow band filters and further comprising tuning the center frequency of the one or more tunable narrow band filters within the frequency range of interest. Still further, the method can include processing sampled signals to identify ultra wideband pulses based upon signals passed through the narrow band filter circuitry.

DESCRIPTION OF THE DRAWINGS

It is noted that the appended drawings illustrate only exemplary embodiments of the invention and are, therefore, not to be considered limiting of its scope, for the invention may admit to other equally effective embodiments.

FIG. 9A is a block diagram for a Nyquist folded bandpass sampling receiver having a modulated and possibly tunable sampling clock.

FIG. 9B is a block diagram for a Nyquist folded bandpass sampling receiver with a tunable and modulated sampling clock and a front-end filter that provides some anti-aliasing.

DETAILED DESCRIPTION OF THE INVENTION

Nyquist folded bandpass sampling receivers are disclosed that utilize wideband filters and modulated sampling clocks to identify received signals. By using one or more clock modulations to induce frequency modulations that are Nyquist zone dependent, multiple Nyquist zones can be aliased together while still allowing for signals from different Nyquist zones to be separated and identified. Further, the addition of the narrow band filter facilitates the reception of ultra wideband signal pulses and, therefore, extends the Nyquist folding bandpass sampling receiver to allow improved processing of ultra wideband (UWB) pulses. As described in more detail below, a variety systems and methods can be utilized as part of the present invention.

Figure 1:
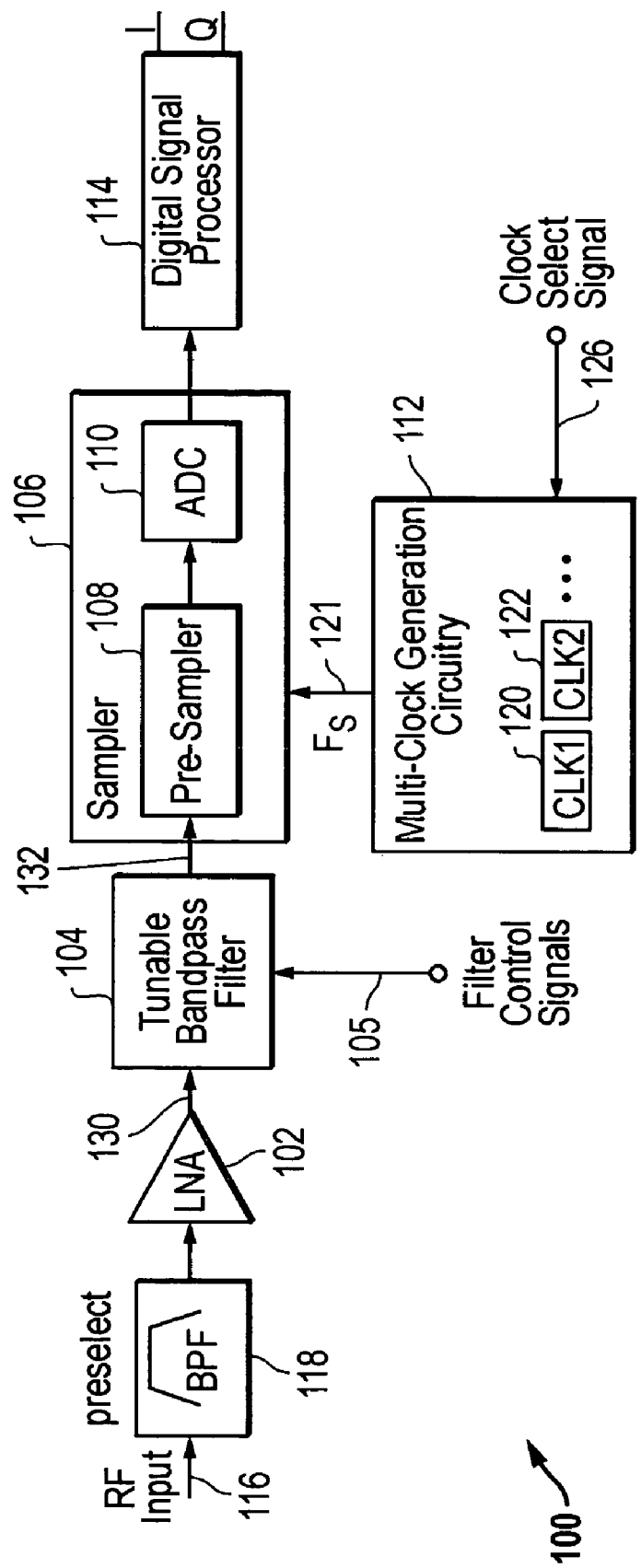
FIG. 1 is a block diagram of an embodiment for a reconfigurable direct radio-frequency (RF) sampling receiver.

Initially, a reconfigurable direct radio frequency (RF) bandpass sampling receiver is discussed with respect to FIG. 1. This reconfigurable direct radio frequency (RF) bandpass sampling receiver is also described in U.S. patent application Ser. No. 11/247,338 entitled "RECONFIGURABLE DIRECT RF BANDPASS SAMPLING RECEIVER AND RELATED METHODS," which was filed on Oct. 11, 2005, which is hereby incorporated by reference in its entirety. Associated receiver architectures that additional take advantage of an analog interpolation filter are then discussed with respect to FIGS. 2A and 2B. This addition of an analog interpolation filter and further embodiments are discussed in more detail in the concurrently filed U.S. patent application Ser. No. 11/545,310, entitled "DIRECT BANDPASS SAMPLING RECEIVERS WITH ANALOG INTERPOLATION FILTERS AND RELATED METHODS," which is hereby incorporated by reference in its entirety. Nyquist folded bandpass sampling receivers are then discussed with respect to FIGS. 3, 4, 5A, 5B, 6A, 6B and 7. An embodiment for a Nyquist folded bandpass receiver adding a narrow band filter for enhancing the reception of ultra wideband (UWB) pulses is described with respect to FIG. 8.

Figure 2A:
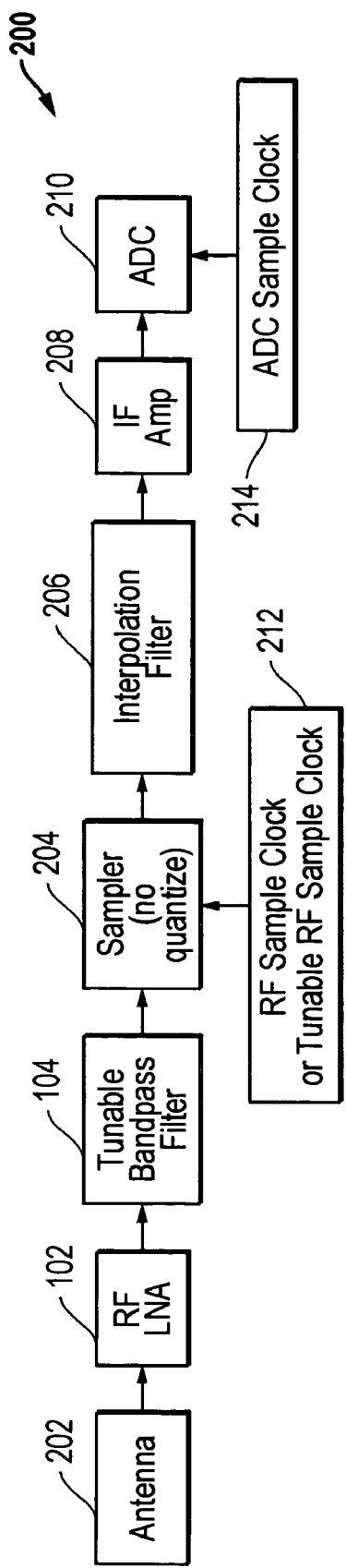
FIG. 2A is a block diagram for an example embodiment of a reconfigurable direct RF bandpass sampling receiver with an analog interpolation filter.
Figure 2B:
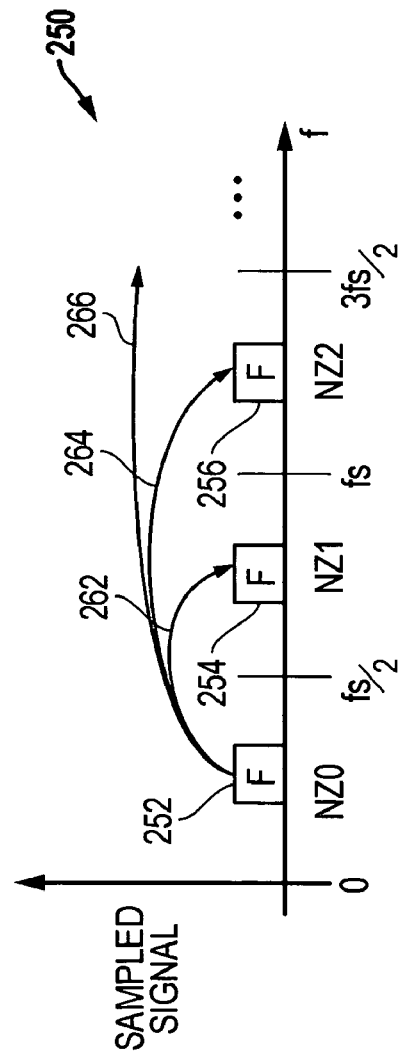
FIG. 2B is a Nyquist zone diagram related to the operation of the analog interpolation filter.

The reconfigurable RF bandpass sampling receiver of FIG. 1 and the analog interpolation filter embodiments of FIGS. 2A and 2B are all effective receiver architectures. The reconfigurable direct RF bandpass sampling receiver of FIG. 1 is particularly advantageous for ELINT type systems and also for receiving wideband signals, more generally. For example, this RF bandpass sampling receiver can be used to detect wideband signals, such as those having a bandwidth of about a few hundred MHz to about 1 GHz or more with the bandwidth being about 5% to 15% of the RF center frequency. The RF bandpass sampling receiver can also have a relatively large tuning range (e.g., from less than 2 GHz to 20 GHz or more). However, this RF bandpass sampling receiver will likely have a moderate dynamic range because, as discussed below, the ADC in this embodiment will typically need to be clocked as fast as RF pre-sampler circuitry is clocked. In addition, the RF pre-sampler and the ADC will often both have to run fast enough to avoid aliasing problems.

In addition to being advantageous for ELINT type systems, the embodiments utilizing analog interpolation filters, as discussed with respect to FIGS. 2A and 2B below, are also advantageous for receivers in communication systems. In these embodiments, the analog interpolation filter acts in operation as an anti-aliasing filter for the ADC. This means that the bandwidth for the receiver can be extremely narrow, if desired. These embodiments, therefore, are particularly useful for communications receivers having narrow bandwidth and high dynamic range requirements. In addition, these embodiments are useful for receiver implementations needing large tuning range requirements, such as is often the case for some multi-mode communications systems, because these embodiments can be more effective at lower frequencies and at higher frequencies than the embodiment of FIG. 1.

Figure 3:
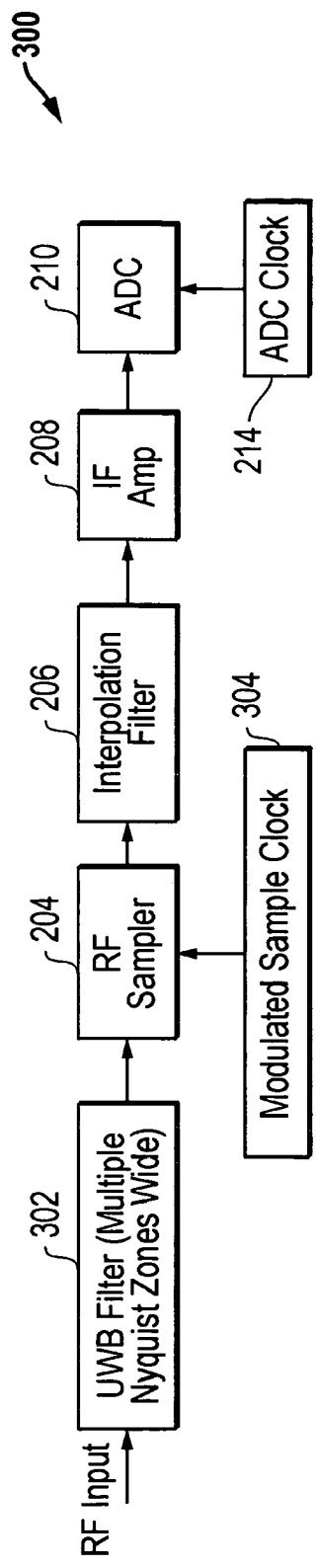
FIG. 3 is a block diagram for a Nyquist folded bandpass sampling receiver.
Figure 4:
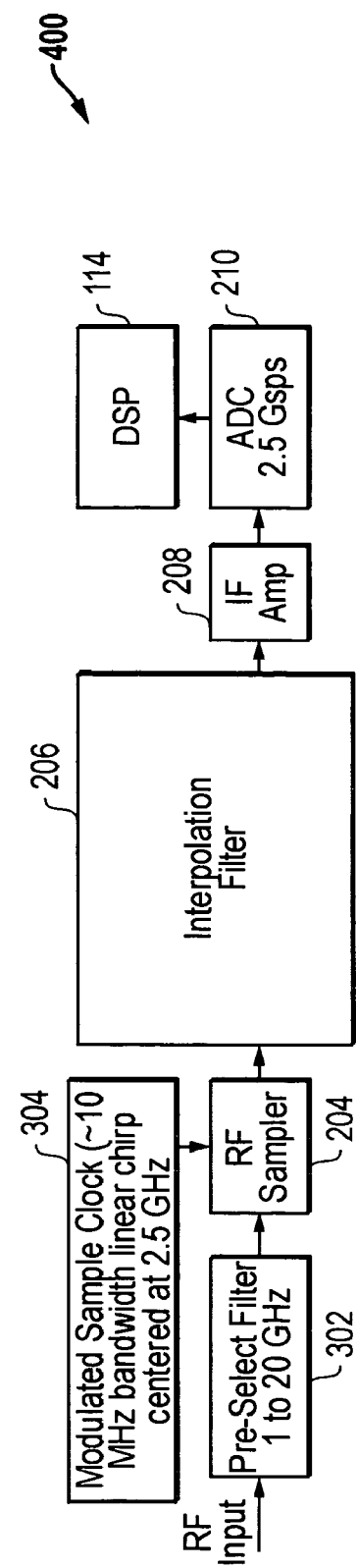
FIG. 4 is a block diagram for a Nyquist folded bandpass sampling receiver having a chirped sample clock signal and a switchable interpolation filter.
Figure 7:
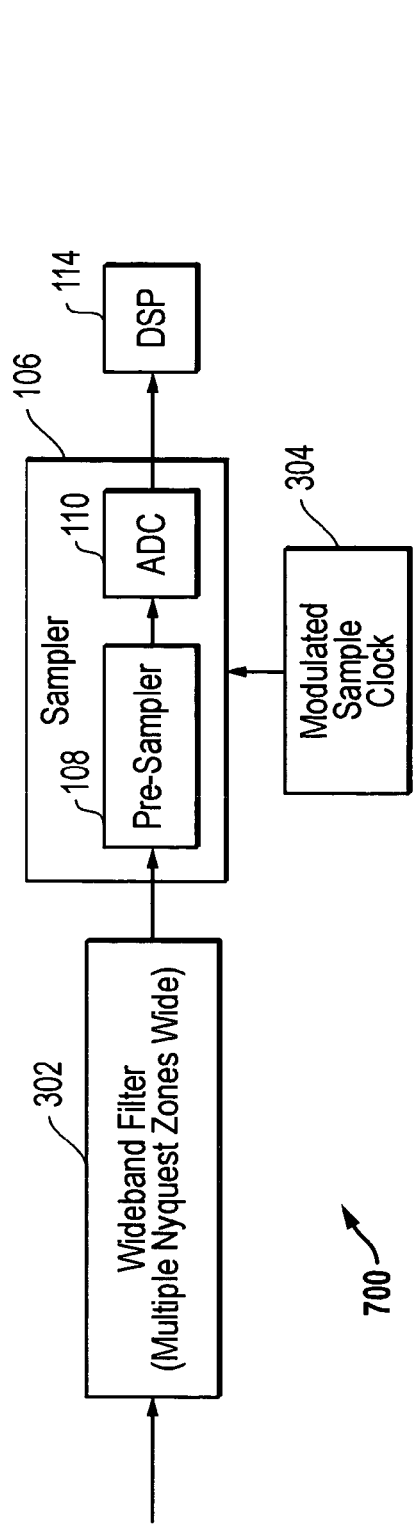
FIG. 7 is a block diagram for a Nyquist folded bandpass sampling receiver that does not use an analog interpolation filter to de-couple the RF sampling clock and the quantization clock.

FIGS. 3, 4 and 7 further depicted example embodiments of Nyquist folded bandpass sampling receivers. These configurations are advantageous for monitoring very large bandwidths with fairly sparse signal environments, and they are particularly advantageous for radar warning receivers (RWRs), electronic support (ES) receivers, electronic support systems (ESS) receivers, and electronic support measures (ESM) receivers. The Nyquist folding bandpass receiver has a wider bandwidth/dynamic range combination than other receiver technologies and architectures. Also, the Nyquist folding bandpass receiver can provide signal copy (where many really wideband receivers cannot provide signal copy), which means that the Nyquist folding bandpass receiver is capable of being used as a communications receiver for certain applications. As depicted, there is no anti-aliasing filter for RF sampling in the Nyquist folding bandpass receivers; however, an anti-aliasing filter can be included for the ADC.

It is noted that the Nyquist folding bandpass receiver can have difficulties seeing really short pulsed signals. The reception of such pulsed signals, such as ultra wideband (UWB) pulsed signals, is improved for the Nyquist folding bandpass receiver with the configuration of FIG. 8. This embodiment adds a narrow band (NB) filter in parallel with the wideband, multi-Nyquist zone filter to improve reception of short pulses.

Now looking first to FIG. 1, a reconfigurable direct radio frequency (RF) bandpass sampling receiver is described that provides direct RF sampling of an input signal spectrum passed through a bandpass filter that is tunable over a wide frequency range of interest and which is sampled based on the bandwidth of the filter rather than the bandwidth of the total frequency range of interest. The bandwidth of the filter may further be variable to provide for optimized search against a variety of signal bandwidths. The reconfigurable direct RF bandpass sampling receiver may be implemented with a single fixed clock for applications where the signals of interest lie in adjacent non-overlapping frequency channels. For applications requiring arbitrary tuning, the reconfigurable direct RF bandpass sampling receiver can also use a programmable or switched sampling clock to avoid the Nyquist sample boundaries that occur with bandpass sampling and thus provide sampling of arbitrary frequencies. A high-speed analog pre-sampler may be included to extend the maximum frequency range that can be sampled. In an electronic intelligence (ELINT) application, this reconfigurable direct RF bandpass sampling receiver architecture provides a method for achieving a much smaller receiver form factor than previously achieved. This receiver architecture also provides a way to achieve better spur performance with less phase noise by tuning the filter, instead of tuning the RF signal, and then by performing bandpass sampling (i.e., sampling at a non-DC frequency). This receiver architecture also provides the optional use of two or more clock sampling frequencies (i.e., FS1, FS2 . . . ) to allow adjustment of the Nyquist boundaries which occur at integer multiples of FS/2.

Although direct RF down-sampling receivers using optical technology have been used, these receivers convert a fixed section of RF bandwidth and are not tunable. Although direct RF bandpass sampling receivers have been proposed, no solution has been presented in prior art to allow direct RF bandpass sampling with tuning over a wide frequency range of interest. Although sampling with switched bandpass filters to implement adjacent channel tuning in a Nyquist-sampled sigma delta architecture has been used, this architecture is fundamentally limited in tuning to higher RF frequencies because of the need for the modulation clock to meet Nyquist sampling criteria for the maximum frequency; furthermore this architecture does not provide arbitrary tuning. In addition, direct RF receivers based on the use of analog high-speed pre-samplers have been built, although not in any reconfigurable architecture. The reconfigurable direct RF bandpass sampling receiver architecture effectively combines aspects of other architectures into a particularly advantageous solution. This receiver architecture is particularly advantageous for applications requiring a wide range of center frequencies extending to very high frequencies such as where signal frequencies are in a range from 2 GHz or lower to 10 or 20 GHz and higher. As such, the receiver architecture is advantageous for us in wide frequency range of interest ELINT receiver implementations.

FIG. 1 is a block diagram of an embodiment 100 for a direct radio-frequency (RF) bandpass sampling receiver. As depicted, the radio frequency (RF) input signal 116 is first passed through an optional pre-select bandpass filter (BPF) 118 and then to a low noise amplifier (LNA) 102. The output 130 of the LNA 102 is provided to a tunable bandpass filter 104, which can be configured to have a tunable center frequency and a programmable bandwidth dependent upon one or more filter control signals 105. The filtered output signal 132 is received by sampler or sampling circuitry 106, which can include a high speed analog pre-sampler 108 and analog-to-digital converter (ADC) circuitry 110. The digital output signals from sampling circuitry 106 are then further processed by digital signal processing (DSP) circuitry 114 to produce baseband in-phase path (I) and quadrature path (Q) signals. The sampler 106 receives a sampling clock (FS) input signal 121 at a desired sampling frequency. This sampling clock (FS) signal 121 determines the sampling frequency for the sampling circuitry 106.

This sampling clock (FS) input signal 121 can be generated by multi-clock generation circuitry 112. As depicted, the multi-clock generation circuitry 112 generates two or more clock signals that can be selected and used as sampling clocks (CLK1, CLK2 . . . ) for the sampling clock signal 121 that is provided to sampling circuitry 106. As shown, two or more clock signals can be generated by the multi-clock generation circuitry 112, namely, a first clock signal (CLK1) 120, a second clock signal (CLK2) 122, and any number of additional clock signals, as desired. A clock select signal 126 is provided to the multi-clock generation circuitry 112 to select which of the clock signals will be used as the output clock signal for the sampling clock signal (FS) 121 to the sampling circuitry 106. It is also noted that multi-clock generation circuitry 112 could be implemented using a wide variety of clock circuits. For example, the multi-clock generation circuitry 112 could be configured to always generate multiple clocks from which a sampling clock is selected. Alternatively, the multi-clock generation circuitry 112 could be configured to generate a single output clock signal that is adjusted according to the clock select signal 126 to provide a programmable clock output signal at the desired sampling frequency. Other variations could be provided, as desired. It is also noted that in some embodiments a single clock signal could be utilized, if desired. In such an implementation, the clock generation circuitry 112 would provide a single fixed sampling clock output signal for the sampling circuitry 106.

As described herein, it is noted that these different clock signals allow for selection of an appropriate sampling clock based on meeting the Nyquist criteria of the bandpass filter and based on criteria so as to avoid Nyquist sampling problems due to Nyquist boundaries. Nyquist zones are determined by the sampling rate for the sampling circuitry 106, and Nyquist criteria locate sampling zone boundaries at integer (K=0, 1, 2, 3 . . . ) multiples of $f_S/2$ starting at DC (frequency=0 Hz). In addition, Nyquist zones alternate between non-inverted and inverted spectrums. Traditional Nyquist criteria states that for bandpass sampling, the sampling rate must be two-times or greater than the bandwidth of the signal frequency range of interest, and that for baseband sampling, the sampling rate must be two-times or greater than the maximum frequency for the signal frequency range of interest.

As frequency ranges within the signal input spectrum are analyzed, depending upon the sampling frequency for the sampling circuitry 106, one or more Nyquist boundaries could be crossed during processing. Thus, by having multiple sampling clock signals available, when a Nyquist boundary for a first sampling clock signal is being reached during processing across a frequency range, a switch can be made to using a second sampling clock signal. As such, the Nyquist boundary will also change based upon this new sampling frequency. In operation, therefore, if the tunable bandpass filter 104 is tuned to a new frequency and its bandwidth includes a Nyquist boundary, a switch could be made to an alternative sampling frequency so that reconstruction problems at the Nyquist boundaries can be avoided. Thus, with proper selection of the sampling clock signals, the respective Nyquist zone boundaries for these sampling clock frequencies can be made far enough apart so that Nyquist sampling problems for the first sampling clock can be avoided by switching to the second sampling clock, and vice versa. In addition, as indicated above, the present invention is not limited to two clock signals, and any number of selectable clock signal frequencies could be provided, as desired.

The reconfigurable direct RF bandpass sampling receiver architecture has a number of advantages. As a direct RF receiver architecture, the receiver 100 can receive high frequency signals without using a mixer to down-convert the incoming RF signal. Instead, the receiver 100 relies upon aliased bandpass sampling within the sampling circuitry 106 in conjunction with the tunable filter 104 to directly down-convert the received signals. To allow sampling of very high frequency RF signals, a high-speed analog pre-sampler may be used. Because this receiver does not utilize a mixer, it avoids phase noise, spurs and mixer products that typically result from generating a local oscillator (LO) mixing signal and mixing it with the incoming RF signal. This receiver can also have faster response times in changing frequency because it does not need the LO to settle. In addition, the receiver uses less hardware and allows for a smaller form factor because no mixer and no tuner are utilized. It is also noted that the clock performance for the clock generation circuitry is preferably tight in order to avoid ADC jitter errors. Again, the multiple clock signals that can be utilized for the sampling clock signal (FS) 121 are provided to help avoid non-recoverable zones around Nyquist boundaries as the tunable filter 104 is adjusted across a frequency band of interest for incoming signals 116. Because tunable bandpass filters are used, the reconfigurable direct RF bandpass sampling receiver can receive frequencies across a wide range of frequencies, unlike previously used optical-based direct RF down-sampling receivers. When implemented with multiple clocks, the reconfigurable direct RF bandpass sampling receiver can furthermore tune to arbitrary frequencies across a wide range of frequencies.

Example circuitry that may be utilized for the sampling circuitry 106 includes pre-samplers available from PICO-SECOND PULSE LABS (PSPL) to allow sampling by an ADC in cases when the frequency of the signal is above the effective bandwidth of the ADC. Example circuitry that may be utilized for the tunable filter 104 includes tunable filter banks available from PARATEK. If desired, other tunable filter technologies could be utilized, such as tunable optical Mach-Zehnder filter technology, tunable image rejection notch filters, tunable bandpass filters based on active inductor technology, tunable filter that use thin film ferroelectric varactors to provide voltage controlled phase shifting, and tunable filters the use RF microelectromechanical systems (MEMS) technology.

Looking back to FIG. 1, it is noted that the preselect filter 118 is optional component (depending on application) to suppress frequencies outside the range of interest. It is also noted that the LNA 102 can be used to increase the gain to within range of the sampling circuitry 106 given any insertion losses of the tunable filter 104, and the LNA 102 can be used to provide for a desired noise figure response. The LNA 102 can be implemented as desired, and the specific implementation for the LNA 102 will be technology and application dependent. In addition, the functionality of the LNA 102 may be split between different component, as desired (e.g., the gain may be spread to optimize for a specific cascade analysis). In some strong signal applications, an LNA may not be required.

The tunable filter 104 can be implemented as a narrowband filter that can be tuned over the frequency range of interest. For ELINT applications, the low end of the frequency range might be from 500 MHz to 2 GHz and the high end of the frequency range might be over 20 GHz. A typical instantaneous bandwidth of the tunable filter could be anywhere from 5% to 15% or more of the center frequency, or the tunable filter could be configured to have an instantaneous bandwidth ranging from 25 MHz to over 1 GHz. The tuning can be implemented via continuous tuning (e.g., a voltage controlled dielectric) or by closely spaced switched filter banks, or by a combination of continuous tuning and switched filter banks. Other implementations could also be used, if desired. Regardless of how the tuning is implemented, the basic form of the reconfigurable direct RF bandpass sampling receiver is characterized by the ability to perform bandpass sampling (i.e., sampling at non-DC frequencies) with arbitrary center frequency over a large RF range of center frequencies. It is noted that if the instantaneous bandwidth approaches a large fraction of the center RF frequency, then the benefits of the reconfigurable direct RF bandpass sampling receiver over full bandwidth sampling will likely decrease. In a possibly limiting case, the instantaneous bandwidth equals the full range of the frequency range of interest, and no tuning is required for the tunable filter 104. At this point, the reconfigurable direct RF bandpass sampling receiver becomes similar to a direct RF bandpass sampling receiver.

The sampler 106 can be a module that inputs the band-limited RF signal and performs analog to digital conversion. The sampler module may include a high-speed analog pre-sampler 108 configured to capture the signal prior to being processed by a sample-and-hold circuit of a typical analog to digital converter (ADC) to allow sampling by an ADC in cases when the frequency of the signal is above the effective bandwidth of the ADC. The ADC 110 can follow the pre-sampler 108. It is noted that the sampler module may be fully integrated and that for some applications the pre-sampler may not be required.

The DSP 114 can include additional digital processing for the received signals. For example, the DSP 114 can include filtering, decimation, conversion of the real sampled data to in-phase/quadrature-phase (I/Q) data, equalization, signal detection, and signal measurement. Additional post-processing DSP functions required by the specific application can also be integrated into the DSP 114, as desired, for the reconfigurable direct RF bandpass sampling receiver.

It is noted that there are key differences between all prior bandpass sampling techniques and the reconfigurable direct RF bandpass sampling receiver. One important difference is that the receiver architecture uses a tunable bandpass filter 104 that can tune to many different Nyquist zones. A second important difference is that the receiver architecture can be tuned to any arbitrary frequency between the minimum and maximum frequency range. To help achieve this result while covering multiple Nyquist zones, the receiver architecture utilizes a second clock. By using a second clock, the reconfigurable direct RF bandpass sampling receiver shifts the Nyquist boundary to a different location, allowing recovery of signals on the Nyquist boundary of the first clock. Prior solutions do not allow a continuous range of frequency coverage that crosses multiple Nyquist boundaries.

The reconfigurable direct RF bandpass sampling receiver allows the flexibility of a reconfigurable heterodyne receiver with wideband frequency coverage without any oscillator-based tuning hardware, thus reducing cost, size, weight, and power (CSWAP) and improving performance in spur performance, tuning speed, and phase noise. In addition, the reconfigurable direct RF bandpass sampling receiver has better dynamic range and improved CSWAP than receivers with instantaneous bandwidth equal to the full frequency range (such as wideband compressive receivers and full bandwidth digitizers). For typical wireless applications with frequency range under a few GHz, the reconfigurable direct RF bandpass sampling receiver has similar advantages as a RF noise shaping sigma delta digital receiver. However, as the maximum frequency of interest increases, the reconfigurable direct RF bandpass sampling receiver is advantageous over the RF noise shaping sigma delta digital receiver because the modulator sampling clock of the RF noise shaping digital receiver is constrained by the Nyquist criteria of the maximum frequency and thus must be at least twice the maximum frequency. Thus for applications such as ELINT/EW/ESM, the reconfigurable direct RF bandpass sampling receiver is, therefore, superior to the RF noise shaping sigma delta digital receiver.

It is noted that the reconfigurable direct RF bandpass sampling receiver also uses bandpass sampling, and there are a few key differences between all of prior bandpass sampling receivers and the reconfigurable direct RF bandpass sampling receiver. One important difference is that the reconfigurable direct RF bandpass sampling receiver uses a tunable bandpass filter that can tune to many different Nyquist zones. A second important difference is that the reconfigurable direct RF bandpass sampling receiver can be tuned to any arbitrary frequency between the minimum and maximum frequency range. In order to achieve this result while covering multiple Nyquist zones, the reconfigurable direct RF bandpass sampling receiver can use a second sampling clock so that the signal can be reconstructed at the Nyquist boundaries. By using a second clock, the reconfigurable direct RF bandpass sampling receiver effectively shifts the Nyquist boundary to a different location, allowing recovery of signals on the Nyquist boundary of the first clock. Prior solutions do not allow such a continuous range of frequency coverage crossing multiple Nyquist boundaries. The multi-signal bandpass sampling concept is limited partially by the fact that the filters are not reconfigurable, but more importantly, the filters are severely constrained in design to avoid overlapping aliased signal spectra. Thus, the reconfigurable direct RF bandpass sampling receiver more flexible than multi-signal bandpass sampling utilized in prior solutions.

Filter control signal 105 is typically used to set the tunable bandpass filter to a particular frequency and bandwidth and is stationary for a period of time before being reconfigured. Alternatively, the filter control signal 105 could be smoothly or rapidly changing (time-varying) in frequency and/or bandwidth similar to the swept bandpass filter receiver described in more detail in U.S. patent application Ser. No. 11/247,314 entitled "SWEPT BANDPASS FILTER FREQUENCY MODULATED CONTINUOUS WAVE (FMCW) RECEIVER AND RELATED METHODS," which was filed on Oct. 11, 2005, and which is hereby expressly incorporated by reference in its entirety. In the reconfigurable direct RF bandpass sampling receiver, however, the time-varying filter avoids having Nyquist boundaries inside the filter bandwidth. Nyquist boundaries may be avoided in the time-varying case by configuring the filter bandwidth to be less than the bandwidth of the particular Nyquist zone (i.e., bandpass region of interest) so that as the filter center frequency changes, the filter bandwidth is always within a single Nyquist zone, or they may be avoided by tuning to separate Nyquist zones while avoiding the boundaries by use of appropriate center frequency and filter bandwidth, or they may be avoided by time-varying the clock appropriately, or through a combination of these techniques. It is noted that in the case where the clock is time-varying to allow the time-varying filter to avoid Nyquist boundaries, signal reconstruction may be difficult, and thus a smoothly or rapidly changing (time-varying) clock would typically be avoided.

Because the physical architecture of the reconfigurable direct RF bandpass sampling receiver is similar to the physical architecture of the swept bandpass filter FMCW receiver, in principle the reconfigurable direct RF bandpass sampling receiver could be modified to function as a swept bandpass filter FMCW receiver by allowing the filter to be time-varying and by allowing the filter to cross Nyquist boundaries and by suitable modification of the DSP. Similarly, the swept bandpass filter FMCW receiver could, in principle, be modified to function as a single-clock embodiment of the direct RF bandpass sampling receiver by discrete tuning the frequency/bandwidth (rather than time-varying) or by appropriate choice of clock so that Nyquist boundaries are avoided as the filter sweeps, and by suitable modification of the DSP to allow reconstruction of the captured time-frequency bandwidth. It is noted that because of typical component limitations, a combined functionality receiver for either direct RF bandpass sampling and/or swept bandpass FMCW receiver would not perform as well and/or would cost significantly more; thus while a combined receiver could, in principle be built, this would not represent best practice. The swept bandpass FMCW receiver provides the best benefit as an IF receiver with a wide-band front-end tuner reducing the RF frequency to the low GHz range with the DSP optimized for detection and measurement of wide bandwidth FMCW signals, while the direct RF bandpass sampling receiver provides the best benefit as an RF receiver operating over a wide range of frequencies from the low GHz range to 20 GHz and above with the DSP optimized for general purpose signal reconstruction, detection, and measurement.

Bandpass receiver architectures that utilize an analog interpolation filter are now discussed with respect to FIGS. 2A and 2B. In particular, FIG. 2A provides a further embodiment where an analog interpolation filter is added to the reconfigurable direct RF bandpass sampling receiver discussed with respect to FIG. 1. And FIG. 2B is a Nyquist zone diagram associated with architecture of FIG. 2A.

As discussed above, the embodiment 100 of FIG. 1 provides for the use of multiple clocks by sampler 106 such that the operation of the pre-sampler 108 and the ADC 110 can avoid Nyquist zone boundaries. In part, the embodiment 100 provides a solution that allows for a much smaller form factor for applications requiring extremely wide tuning bandwidth. It also provides a way to achieve better spur performance by tuning the filter instead of timing the RF signal and then performing bandpass sampling with a second clock to allow adjustment of the Nyquist boundaries (which occur at integer multiples of $F_s/2$). One potential problem with the embodiment 100 of FIG. 1, however, is that the pre-sampler 108 can act as a type of extended sample-and-hold for the analog-to-digital converter (ADC) 110 so that the quantization rate of the ADC 110 will equal the RF bandpass sample rate of the pre-sampler 108. This implies that the digital signal processing (DSP) 114 will be interacting with a switchable or tunable sampling clock signal ($F_S$) 121. In addition, it may be difficult to use a slower-speed high-dynamic-range ADC because the RF bandpass sample rate will typically be high. A high RF bandpass sample rate is preferred in general because the dynamic range of the RF bandpass sampling is greater and because this allows a wider transition region for the tunable or switchable filter 104 thereby simplifying the filter design. Another problem caused by the requirement for synchronous sampling is that in implementations where the pre-sampler 108 and ADC 110 are separate physical devices (which is typically the case for sampling for high frequency RF signals with current technology) is that precision delays must typically be used. For example, a delay can be added to a common clock signal used by the pre-sampler 108 and the ADC 110 in order to provide for synchronous sampling.

FIG. 2A provides an embodiment where an analog interpolation filter is added to the reconfigurable direct RF bandpass sampling receiver discussed with respect to FIG. 1. The addition of the analog interpolation filter allows the ADC clock to be de-coupled, and potentially completely de-coupled, from the RF sample clock. Thus, this modification of the architecture of FIG. 1 allows the quantization to be performed at a much slower rate than the initial sampling and allows the final analog bandwidth to be much narrower than the bandwidth of the first stage filter located before the high-speed sampler. The combination of a tunable bandpass filter, tunable bandpass sample clock and analog interpolation filter followed by a further stage of sampling and quantization at a slower rate than the bandpass sample clocking provides significant advantageous by de-coupling the quantization sample rate from the high-speed sample rate. As with the embodiment 100 of FIG. 1, the embodiment 200 of FIG. 2 provides a simplified receiver architecture capable of covering extremely large RF ranges (e.g., from less then 2 GHz to greater than 20 GHz) and suitable for a variety of signal applications including electronic intelligence (ELINT) signal applications with typical instantaneous bandwidth of 5% to 15% of the center frequency. Further, the addition of the narrower analog interpolation filter also allows arbitrarily narrow instantaneous bandwidth for various applications including communications and narrow-band searching.

Looking now in more detail to FIG. 2A, a block diagram is depicted for an example embodiment 200 of a reconfigurable direct RF bandpass sampling receiver with an analog interpolation filter 206. The overall receiver architecture for embodiment 200 is similar to that for embodiment 100 of FIG. 1. However, the functionality of the sampler 106 of FIG. 1, which included pre-sampler 108 and ADC 110, has been implemented as a non-quantizing sampler 204, an analog interpolation filter 206, intermediate frequency (IF) amplifier 208 and ADC 210. The non-quantizing sampler 204 receives a RF sampling clock signal from RF sample clock circuitry 212, and the ADC 210 receives a quantization sampling clock signal from ADC sample clock circuitry 214. Because the ADC 210 has been de-coupled from the non-quantizing sampler 204 through the analog interpolation filter 206, the RF sample clock signal and the ADC sample clock signal can be different. It is noted that RF sample clock circuitry 212 can also be configured to provide a tunable or selectable RF sample clock, if desired. As discussed above with respect to clock circuitry 112 in FIG. 1, the RF sample clock circuitry 212 can generate a clock signal having a tunable frequency or can generate a number of selectable clock signals.

As further depicted in FIG. 2, the antenna 202 provides an RF input signal to the RF low noise amplifier (RF LNA) 102. This amplified signal is then provided to the tunable bandpass filter 104, which is discussed above. The signal is then processed by the non-quantizing sampler 204, passed through the analog interpolation filter 206, and then digitized with ADC 210. As shown, an additional amplifier 208 can be provided before the ADC 210 which amplifies the output of the analog interpolation filter 206 and is configured to operate at the intermediate frequency (IF) output by the analog interpolation filter 206.

Numerous advantages are achieved through the addition of the analog interpolation filter 206 between the high-speed non-quantizing sampler 204 and the ADC 210. This implementation allows the quantization sample rate of the ADC 210 to be de-coupled, and potentially completely de-coupled, from the RF bandpass sample rate of the non-quantizing sampler 204. In particular, in comparison with embodiment 100 of FIG. 1, the embodiment 200 of FIG. 2 allows the quantization in ADC 210 to occur at a much slower rate than the rate of the ADC 110 and sampler 108 within the sampler 106 of FIG. 1.

It is noted that the analog interpolation filter 206 is a filter having bandwidth less than or equal to the Nyquist bandwidth of the high-speed non-quantizing sampler 204 in order to help provide smooth interpolation. This interpolation greatly facilitates the de-coupling of the high-speed RF sample rate of the non-quantizing sampler 204 from the quantization sample rate of the ADC 210. It is also noted that the analog interpolation filter 206 is different in function from a wideband IF (intermediate frequency) filter that could be placed at the output of a high-speed sampler 106 in FIG. 1 in order to help stretch the pulse as part of a sample-and-hold process. Such a wideband IF filter for purposes of stretching the pulse has been used, for example, with respect to pre-samplers available from PICOSECOND PULSE LABS (PSPL).

FIG. 2B is a Nyquist zone diagram related to the operation of the analog interpolation filter. As depicted, the diagram 250 represents the sampled signal versus frequency and shows the Nyquist zones created based upon the RF sampling rate ($F_S$) from the RF sample clock 212, which can be a tunable or selectable RF sample clock as discussed above. In particular, a baseband Nyquist zone (NZ0) is created between zero and $F_S/2$. A first Nyquist zone image (NZ1) is created between $F_S/2$ and $F_S$. A second Nyquist zone image (NZ2) is created between $F_S$ and $3F_S/2$, and so on. The quantization sample clock for the ADC 210 can then be operated to determine the Nyquist zone from which the signals will be quantized. The filter response for the analog interpolation filter 206 is represented as filter response (F) 252 in the baseband Nyquist zone (NZ0). The filter response then also imaged into each Nyquist zone image as represented by arrows 262, 264 and 266. As shown, the analog interpolation filter 206 is seen as filter response (F) 254 in the first Nyquist zone image (NZ1), as filter response (F) 256 in the second Nyquist zone image (NZ2) 256, and so on.

With respect to the quantization sample clock for ADC 210, the quantization sample clock could be made to be fixed for applications in which the desired frequency range can be received without tuning the quantization sample clock. If desired, the quantization clock for the ADC 210 could also be implemented as a tunable clock signal to provide greater flexibility in overall system tuning to frequencies of interest. For example, the quantization clock would typically be implemented as a tunable clock if the ADC 210 is performing bandpass sampling and if the interpolation filter is tunable in order to properly perform bandpass sampling. On the other hand, if the interpolation filter is tunable in a hybrid architecture with an RF tuning element after the interpolation filter, then the quantization clock sample rate would typically be determined by the bandwidth requirements and not the bandpass sampling requirements.

In operation, the embodiment 200 of FIG. 2A provides the advantage of de-coupling the high-speed sampling and quantization processes by using an analog interpolation filter after the bandpass sampling and before the quantization. As such, the sampling and quantization can be completely de-coupled from the RF bandpass sampling process, if desired, and the Nyquist zone within which the ADC 210 operates can be selected as shown with respect to FIG. 2B. In prior bandpass sampling, the sampling/quantization process is typically performed at the same time as the RF sampling, with most of the power requirements tied to the quantization function rather than the RF sampling function. The analog interpolation filter provides significant advantages including simplifying the ADC timing, simplifying the DSP processing of the quantized output signals, reducing total power consumption, allowing for a high-dynamic range ADC to be used, allowing for tunable bandpass sampling at an intermediate frequency (IF), and allowing for multi-stage bandpass sampling.

As discussed above, the reconfigurable direct RF bandpass sampling receiver of FIG. 1 provides a method for achieving a smaller form factor than previously possible for applications requiring extremely wide tuning bandwidth and also provides a way to achieve better spur performance by tuning the filter instead of tuning the RF signal and then performing bandpass sampling with tunable and/or multiple clock signals to allow adjustment of the Nyquist boundaries. The addition of an analog interpolation filter, as shown with respect to FIG. 2, allows the quantization sample rate to be de-coupled from the RF bandpass sample rate.

Figure 8:
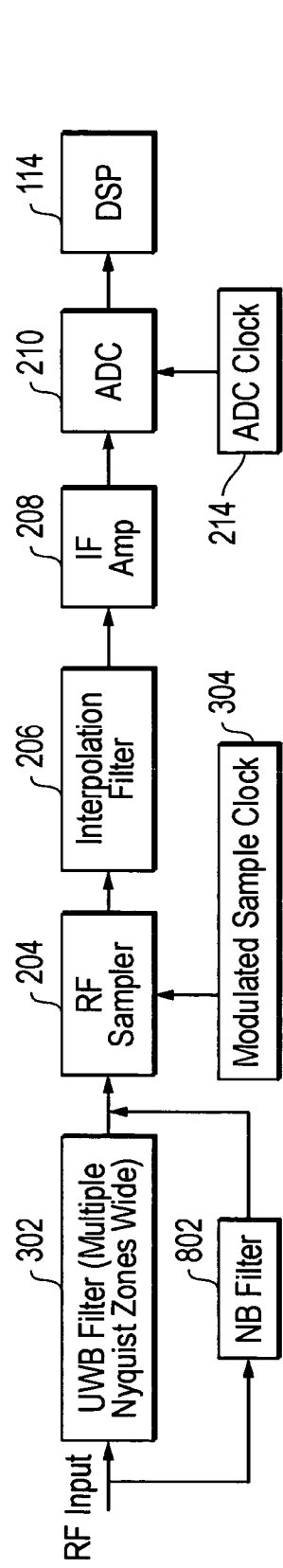
FIG. 8 is a block diagram for a Nyquist folded bandpass sampling receiver having a narrow band filter to improve reception of ultra wideband pulsed signals.

Nyquist folded bandpass sampling receivers, which can utilize the receiver architectures described with respect to FIG. 1 and FIG. 2A above, are now discussed with respect to FIGS. 3, 4, 5A, 5B, 6A, 6B, 7 and 8. In particular, FIG. 3 depicts an embodiment of a Nyquist folded bandpass sampling receiver that uses an ultra wideband (UWB) front-end filter so that multiple Nyquist zones are received. Thus, for this Nyquist folded bandpass sampling receiver, the filter 302 serves as a pre-select filter instead of serving as an anti-aliasing filter for the RF-sampler 204. FIG. 4 depicts a further embodiment related to FIG. 3. FIGS. 5A, 5B, 6A and 6B provide signal diagrams related to the operation of the Nyquist folded bandpass sampling receiver. FIG. 7 provides a Nyquist folded bandpass sampling receiver that does not use an analog interpolation filter to de-couple the RF sampling clock and the quantization clock. Although the de-coupling of the RF bandpass sample clock and the quantization clock is helpful for the Nyquist folded bandpass sampling receiver, having separate clocks is not required, and the present invention includes implementations using other clock arrangements such as where the clocks are synchronized, for example, with the embodiment of FIG. 7. FIG. 8 provides a Nyquist folded bandpass sampling receiver including the addition of a narrow band filter in the front end to improve the reception of UWB pulsed signals because, without an anti-aliasing filter, UWB pulses are not stretched by the anti-aliasing filter and are likely to pass through the RF sampler without being seen.

FIG. 3 is a block diagram for an example embodiment 300 of a direct RF bandpass sampling receiver with a ultra wideband (UWB) front end filter to allow reception of multiple Nyquist zones. Similar to embodiment 200 of FIG. 2A, embodiment 300 includes a non-quantizing RF sampler 204 followed by an analog interpolation filter 206, an intermediate frequency amplifier (IF Amp) 208, and an analog to digital converter (ADC) 210. As with embodiment 200, the ADC 210 receives an ADC sampling clock signal from ADC clock circuitry 214. In addition, a digital signal processor (DSP) may receive digital signals from the ADC 210 and process these digital signals to identify and remove the Nyquist-zone specific modulation in order to recover the original signal. Thus, the DSP circuitry can be configured to remove the induced modulation associated with the Nyquist zone in which the signal was located and to acquire the original signal by utilizing the Nyquist zone in which the signal was located, removing an induced modulation for that Nyquist zone, and acquiring the original signal.

In contrast with embodiment 200 of FIG. 2A, embodiment 300 includes an ultra wideband (UWB) filter 302 in front of the non-quantizing RF sampler 204 and uses modulated RF sample clock circuitry 304. The wideband filter 302 has a bandwidth that is wide enough to pass multiple Nyquist zones where the Nyquist zones are determined by the RF sampling clock frequency for the non-quantizing RF sampler 204. The modulated sample clock circuitry 304 provides an RF sampling clock signal to the non-quantizing RF sampler 204 that is not constant and is adjusted or modulated during sampling. For example, the modulation could be a chirped sampling clock signal, although other types of modulated clock signals could also be used depending upon the results desired. In one example implementation, the wideband filter circuitry can be configured to have a bandwidth of 20 GHz or more, and the modulated sampling clock signal can be generated to have a sampling rate of 2 GHz or more. Other implementations could be made, as desired.

FIG. 4 is a block diagram for an embodiment 400 for a Nyquist folded bandpass sampling receiver using a switchable chirped sampling clock signal and a fixed low-pass interpolation filter. As depicted, the embodiment 400 has a switchable modulated sample clock for the RF sample clock 304. The fixed interpolation filter is implemented as a low-pass filter with a 3-dB bandwidth of about 1 GHz and a stop-band bandwidth of about 1.25 GHz meeting the anti-aliasing requirements of the ADC 210. In addition, the embodiment 400 in FIG. 4 includes a pre-select filter passing frequencies from 1 GHz to 20 GHz as the front-end wideband filter 302. Also as depicted, the switchable modulated sample clock circuitry 304 provides a linear chirp clock signal that has a bandwidth of about 10 MHz and can be configured to have two RF carriers centered at about 1.9 GHz and at about 1.8 GHz. Further, the ADC 210 has a quantization sampling rate of about 2.5 Giga-samples per second (Gsps). The receiver depicted in FIG. 4 has an instantaneous bandwidth (IBW) of over 15 GHz. A total of about 20 Nyquist zones with bandwidth about 950 MHz and about 800 MHz (depending on the center frequency of the modulated RF sample clock 304) are seen by the RF sampler 204, and the interpolation filter 206 passes all of each Nyquist zone. The ADC 210, therefore, sees over 15 GHz folded into the interpolation filter's instantaneous bandwidth of roughly 1 GHz. Despite this extremely large IBW, however, the example Nyquist folding receiver of FIG. 4 will likely not be able to process accurately pulses with duration less than 500 pico-seconds since extremely short pulses may fall between samples in the RF sampler for this particular RF sample rate. The embodiment in FIG. 8, as discussed below, can be used to address improved reception of short pulses.

The bandpass sampling Nyquist folding receivers, therefore, uses Nyquist folding in conjunction with non-uniform sampling to enable extremely wide bandwidth receivers. In operation, multiple Nyquist zones are passed through the wideband filter 302, and these Nyquist zones are allowed to fold on top of each other during sampling. Because the RF sampling clock is modulated, however, the signals that are folded together from different Nyquist zones can be identified and distinguished. For example, by using a shallow triangle frequency chirp as depicted in FIG. 4, separate modulations are induced within each Nyquist zone. As such, when the Nyquist zones fold on top of each other, the different signals from different Nyquist zones can be separated and identified based on the fact that the induced modulation is different for each Nyquist zone. Thus, by using one or more clock modulations to induce frequency modulations that are Nyquist zone dependent, multiple Nyquist zones can be aliased together while still allowing for signals from different Nyquist zones to be separated and identified. Because the induced modulations can be measured, a determination can be made without ambiguity of the Nyquist zone from which the signal originated. The wideband filter and modulated sampling clock, therefore, make it possible to cover an extremely wide bandwidth with a relatively slow, high dynamic range ADC in environments where the signal density is relatively sparse. It is noted that the wideband filter, if desired, can have a bandwidth of 10 GHz or 20 GHz or more and the associated sampling rate can be 1 GHz or 2 GHz or more. Other wideband filters could also be utilized, and the bandwidth could be selected as desired depending upon the rate of the sampling clock and the number of Nyquist zones desired to be passed It is also noted that the wideband pre-select filter 302 does not need to be contiguous. Thus, different sub-regions of the total frequency span of interest may be selected simultaneously without regard to aliasing issues instead of selecting the total frequency span. It is also noted that the pre-select filter 302 may be tunable and or reconfigurable in other ways. For example, in the case where the pre-select filter 302 selects sub-regions, it may be advantageous to tune the sub-regions to cover different areas in response to jammers or to time-varying frequency regions of interest.

It is noted that the modulated clock signal can be configured as desired to generate non-uniform sampling. For example, as used above, a chirp frequency modulated RF sampling clock signal could be used, and the chirp could be based upon a linear sawtooth modulation (sometimes referred to as a linear chirp), a sinusoidal modulation (sometimes referred to as sinusoidal frequency chirp), a triangle frequency modulation (sometimes called a triangle chirp), and/or any other desired chirp modulation scheme. Other modulated clock signals and combinations of modulations could also be used to provide non-uniform sampling, including frequency shift key, frequency agile, phase shift, general frequency modulation, etc. One combination that could be used is a triangle frequency modulation combined with an FSK (frequency shift key) modulation. It is also noted that the clock modulation may be switchable as described above, or it may be otherwise reconfigurable. For example, it may be advantageous to change the clock modulation from one type of modulation to another type of modulation in order to improve the performance against different classes of signals.

As discussed here, this non-uniform sampling allows for the frequency modulations generated by sampling to be different in different Nyquist zones. As long as a modulated sampling clock is used that will generate this result, then the desired advantages of the Nyquist folded bandpass sampling receiver architectures described herein can be achieved. As such, a single clock modulation, or multiple clock modulations, mathematically translate into different signal modulations depending upon the Nyquist zone in which the signals are located before being folded together thereby allowing separation of the aliased signals and determination of the Nyquist zone from which they came. It is further noted that the modulated sampling clock may be tunable or switchable such that the frequency of the clock signal may be tuned to a desired frequency and/or one of a plurality of generated clock signals may be selected. In addition, the modulated sampling clock may be configured such that the modulation for the modulated sampling clock is adjusted during operation of the receiver. Other variations and implementations could also be utilized, if desired.

For example, a shallow linear chirp can be used for the RF sampling clock to generate non-uniform sampling. Assuming the shallow linear chirp varies the sampling clock according to a slope X, signals in the Nth Nyquist zone will have induced slope magnitude given by X*ceiling(N/2) when they are uniformly re-sampled after the interpolation filter, and the slope direction will be alternating for adjacent Nyquist zones because of spectral reversal. Assuming, for example, the wideband filter 302 allows an extremely wide input bandwidth between DC (0 GHz) to about 20 GHz and sampling occurs at 2 Giga-samples per second (Gsps) for a plurality of relatively sparse pulsed signals, twenty Nyquist zones will be aliased into each other during sampling, and a measurement of the chirp slope on each pulse can be used to determine from which Nyquist zone each pulse came. The baseband Nyquist zone covering DC to about 1 GHz will have no induced slope. The first Nyquist zone covering about 1 GHz to about 2 GHz will have induced slope=X. The second Nyquist zone covering about 2 GHz to about 3 GHz will have induced slope=−X. The third Nyquist zone covering about 3 GHz to about 4 GHz will have induced slope=2X, and so on. The ability to make this determination, however, will typically rely upon the pulse signal density being fairly low. It is noted that the signal inputs are not restricted to pulses and that pulsed signals are used in this example to simplify the discussion. A more specific example using a linear chirp modulation for the sampling clock is now described with respect to FIGS. 5A and 5B.

Figure 5A:
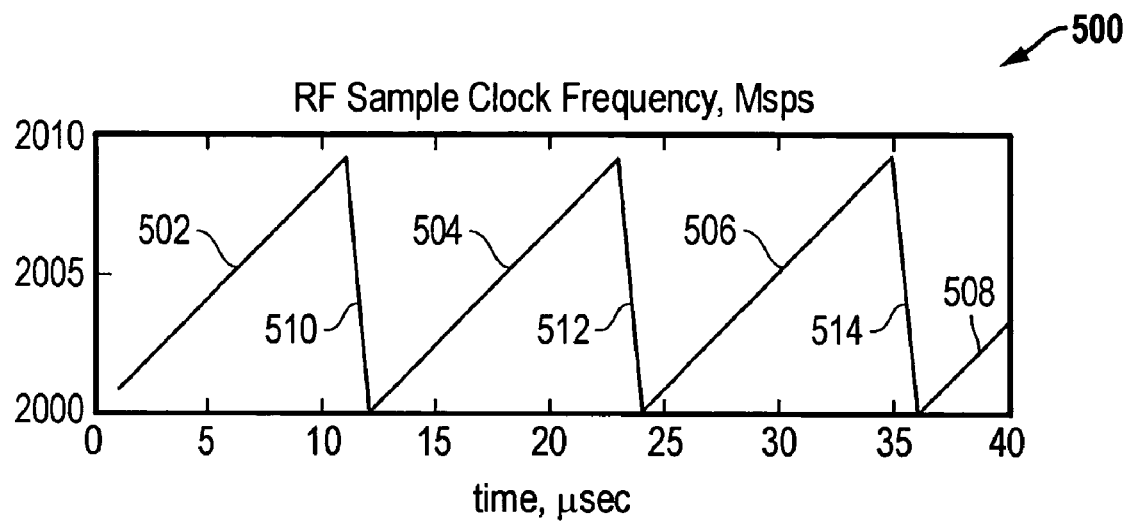
FIG. 5A is signal diagram for a modulated RF sampling clock using chirp or ramp modulation.

FIG. 5A is signal diagram 500 for a modulated RF sampling clock using chirped or ramped clock signal. As depicted, the RF sample clock frequency ramps between a rate of 2000 Mega-samples per second (Msps) and 2010 Msps about every 12 micro-seconds (μsec). In particular, the RF sample clock signal starts at about 2000 Msps and ramps to about 2010 Msps from 0 to 12 μsec as represented by segment 502. The sample clock signal then drops back down to 2000 Msps as represented by segment 510. This modulation of the sample clock signal then repeats as represented by ramping segments 504, 506 and 508 and by reset segments 512 and 514. As such, the RF sampling clock signal received by the non-quantizing RF sampler 204 is not constant and is adjusted as the sampling occurs.

Figure 5B:
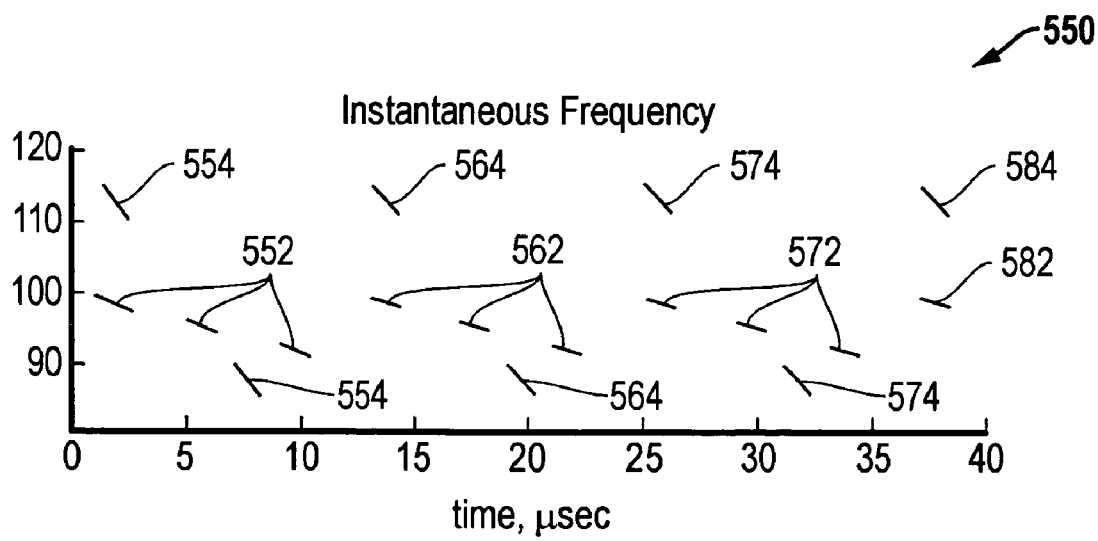
FIG. 5B is signal diagram for instantaneous frequency of two received signals using the modulated RF sampling clock of FIG. 5A.

FIG. 5B is signal diagram 550 for instantaneous frequency of two received signals using the modulated RF sampling clock of FIG. 5A after passing through an interpolation filter located in the baseband Nyquist zone. For this example, the first received signal is at 2100 MHz and has a pulse width of 1 μsec and a pulse repetition interval of 4 μsec. The second signal is at 10120 MHz and has a pulse width of 1 μsec and a pulse repetition interval of 6 μsec. As shown in FIG. 5A, the RF sampling clock is a linear sawtooth that ramps from 2000 Msps to 2010 Msps with a period of 12 μsec. For this example, the first signal is located in the second Nyquist zone (ie., from 2000 MHz ($f_S$) to 3000 MHz ($3f_S/2$) when counting the baseband Nyquist zone from 0 MHz ($f_S$) to 1000 MHz ($f_S/2$) as the zero$^{th}$ Nyquist zone). The second signal is located in the tenth Nyquist zone from (i.e., from 10000 MHz ($5f_S$) to 11000 MHz ($11f_S/2$)).

Looking to FIG. 5B, the instantaneous frequency for the first received signal is represented by a first set of samples 552 that are obtained during the first ramp segment 502 in FIG. 5A. Instantaneous frequency for the second received signal is represented by a second set of samples 554 that are obtained during the first ramp segment 502 in FIG. 5A. During the second ramp segment 504 in FIG. 5A, another set of samples 562 are obtained that are related to the first received signal, and another set of samples 564 are obtained that are related to the second received signal. This repeats again for the third ramp segment 406 in FIG. 5A where a set of samples 572 are obtained for the first received signal and where a set of samples 574 are obtained for the second received signal. Only a portion of the time for the next ramp segment 508 in FIG. 5A is depicted, where samples 582 and 584 are obtained. From the sets of samples 552, 562 and 572 for the first received signals and the sets of samples 554, 564 and 574 for the second received signals, it can be discerned that the second signal's frequency slope is significantly steeper than the first signal's frequency slope. As such, the slope can be measured, and the original Nyquist zone from which these signals originated can determined even though these two signals will have been folded together during sampling. It is also noted that signals from odd-numbered Nyquist zones (1st, 3rd, etc.) will have opposite induced modulation slope than signals from even-numbered Nyquist zones.

Thus, by modulating the RF sampling clock signal to produce non-uniform sampling, such as through the use of the linear chirped signal in FIG. 5A, the instantaneous frequencies obtained for different received signals will appear with a particular signature, such as the different slops related to each sample set 552, 562 and 572 for the first signal and each sample set 554, 564 and 574 for the second signal, as depicted in FIG. 5B. Even though the Nyquist zones fold on top of each other, different signals from different Nyquist zones can be separated and identified based on the fact that the added modulation is different for each Nyquist zone. The use of one or more clock modulations to provide non-uniform sampling and to induce frequency modulations that are Nyquist zone dependent allows multiple Nyquist zones can be aliased together while still allowing for signals from different Nyquist zones to be separated and identified. This Nyquist folding is further described with respect to FIGS. 6A and 6B.

Figure 6A:
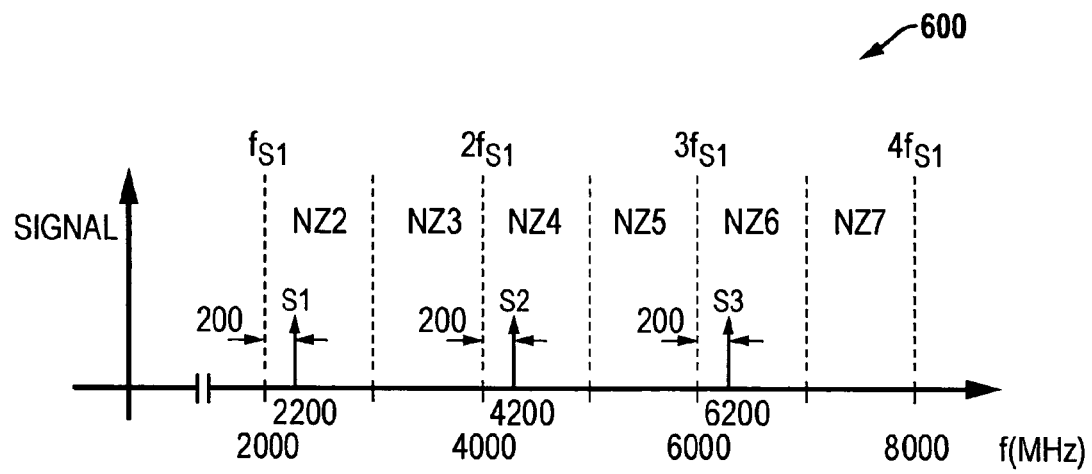
FIG. 6A is a Nyquist zone diagram for three signals received when the modulated RF sampling clock signal is at a first frequency.

FIG. 6A is a Nyquist zone diagram 600 for three signals received when the modulated RF sampling clock signal is at a first frequency. In this example, the sampling clock signal ($f_{S1}$) is 2000 MHz. Thus, a first signal (S1) sitting at 2200 MHz is located in Nyquist zone 2 (i.e., from 2000 MHz ($f_S$) to 3000 MHz ($3f_S/2$)) and is 200 MHz away from the sampling clock signal ($f_{S1}$). Other signals may be indistinguishable from this signal once sampled if they or their images are also 200 MHz from the sampling clock signal ($f_{S1}$) or a harmonic ($2f_{S1}$, $3f_{S1}$, $4f_{S1}$) of the sampling clock signal ($f_{S1}$). For example, a second signal (S2) sitting at 4200 MHz is located in Nyquist zone 4 (i.e., from 4000 MHz ($2f_S$) to 5000 MHz ($5f_S/2$)) and is 200 MHz away from the second harmonic ($2f_{S1}$) of the sampling clock signal ($f_{S1}$). Once sampled, this second signal (S2) will be folded on top of the first signal S1 and may be difficult to distinguish from the first signal S1. Similarly, a third signal (S3) sitting at 6200 MHz is located in Nyquist zone 6 (i.e., from 6000 MHz ($3f_S$) to 7000 MHz ($7f_S/2$)) and is 200 MHz away from the third harmonic ($3f_{S1}$) of the sampling clock signal ($f_{S1}$). Once sample, this third signal (S3) is also folded on top of the first signal S1 and may be difficult to distinguish from the first signal (S1) and/or the second signal (S2). It is seen, therefore, that by allowing multiple Nyquist zones through the wideband filter 302, signals within these Nyquist zones will be folded onto each other through the sampling process. However, as discussed above, by modulating or adjusting the sampling clock signal, these signals can be distinguished. This is further depicted with respect to FIG. 6B.

Figure 6B:
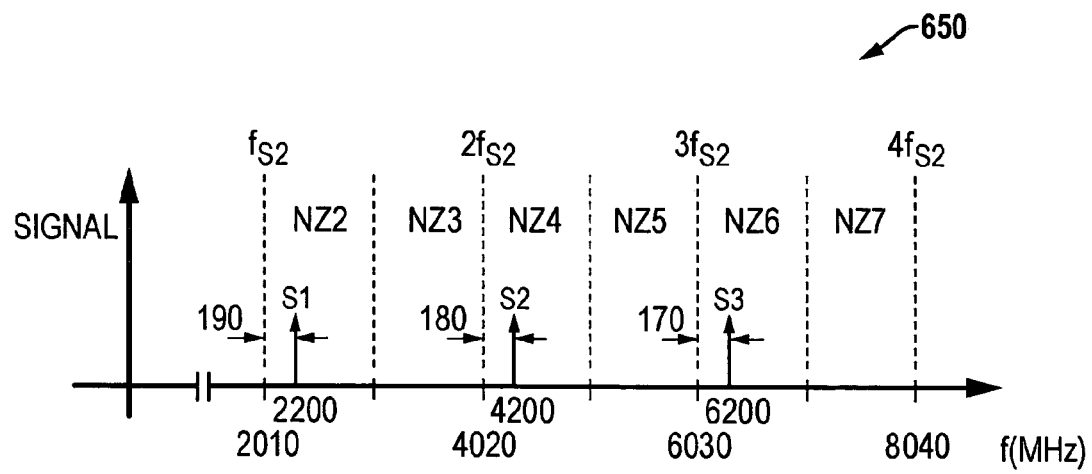
FIG. 6B is a Nyquist zone diagram for three signals received when the modulated RF sampling clock signal is at a second frequency.

FIG. 6B is a Nyquist zone diagram 650 for the three signals received in FIG. 6A when the modulated RF sampling clock signal is at a second frequency. As depicted, the adjusted sampling clock signal ($f_{S2}$) is 2010 MHz. Thus, the first signal (S1) sitting at 2200 MHz is 190 MHz away from the adjusted sampling clock signal ($f_{S2}$). The other signals (S2 and S3) are now distinguishable from this signal because they are no longer 200 MHz from the sampling clock signal ($f_{S2}$) or a harmonic ($2f_{S2}$, $3f_{S2}$, $4f_{S2}$) of the sampling clock signal ($f_{S2}$). For example, the second signal (S2) sitting at 4200 MHz is now 180 MHz away from the second harmonic ($2f_{S2}$) of the sampling clock signal ($f_{S2}$). Similarly, the third signal (S3) sitting at 6200 MHz is now 170 MHz away from the third harmonic ($3f_{S2}$) of the sampling clock signal ($f_{S2}$). Thus, by modulating or adjusting the sampling clock signal, the three signals can now be distinguished from each other.

It is noted that the Nyquist zones in FIGS. 6A and 6B are labeled based upon the assumption that the baseband Nyquist zone from $f_S$ to $f_S/2$ is counted as the zero$^{th}$ Nyquist zone. As such, the first Nyquist zone (NZ1) is from $f_S/2$ to $f_S$ (not shown). The second Nyquist zone (NZ2) is from $f_S$ to $3f_S/2$. The third Nyquist zone (NZ3) is from $3f_S/2$ to $2f_S$. The fourth Nyquist zone (NZ4) is from $2f_S$ to $5f_S/2$. The fifth Nyquist zone (NZ5) is from $5f_S/2$ to $3f_S$. The sixth Nyquist zone (NZ6) is from $3f_S$ to $7f_S/2$. The seventh Nyquist zone (NZ7) is from $7f_S/2$ to $4f_S$, and so on. Signals in each of these Nyquist zones will be folded on top of each other during sampling, assuming that the wideband filter 302 allows these Nyquist zones to pass through to the RF sampling circuitry.

FIG. 7 is a block diagram for an embodiment 700 a Nyquist folded bandpass sampling receiver that does not use an analog interpolation filter to de-couple the RF sampling clock and the quantization clock. As depicted and described above, a wideband filter 302 has a bandwidth that is wide enough to cover multiple Nyquist zones. The modulated sample clock circuitry 304 provides a modulated sampling clock signal to the sampler 106. As with the embodiment 100 of FIG. 1, the sampler 106 includes a pre-sample 108 and an ADC 110. The output of the ADC 110 is provided the digital signal processor (DSP) 114. It is further noted that other variations and architectures could be utilized while still taking advantage of a wideband filter 304 and a modulated sampling clock circuitry 304. As discussed above, the wideband filter has a bandwidth wide enough to allow multiple Nyquist zones (based upon the RF sampling clock signal) to pass through, and the modulated sampling clock circuitry 304 provides a mechanism for distinguishing signals within different Nyquist zones that end up being folded together during the RF sampling process.

One potential problem with the Nyquist folded bandpass sampling receiver is its ability to handle pulsed signals with very wide bandwidths such as ultra wideband (UWB) pulsed signals. As indicated with respect to FIG. 4 above, the example Nyquist folding receiver of FIG. 4 will likely not be able to process accurately pulses with duration less than 500 picoseconds, or bandwidth greater than approximately about 2 GHz. To overcome this potential problem, a narrow band filter can be added in parallel with the wideband filter 302 at the front end of the Nyquist folded bandpass sampling receiver so that UWB pulses can be more accurately processed. FIG. 8 provides such an embodiment.

FIG. 8 is a block diagram for an embodiment 800 of a Nyquist folded bandpass sampling receiver having a narrow band (NB) filter 802 to improve reception of ultra wideband signals. In particular, the RF input signal is provided both to the ultra wideband (UWB) filter 302, which is wide enough to cover multiple Nyquist zones as discussed above, and to the narrow band (NB) filter 802. The outputs of the wideband filter 302 and the narrow band filter 802 are then combined before being sampled by the non-quantizing RF sampler 204. The rest of the embodiment 800 is similar to the embodiment 300 of FIG. 3 as discussed above. As with the other embodiments described herein, the intermediate frequency amplifier (IF Amp) 208 can be located where desired and is not required to be placed in front of the ADC 210. If desired, there may be a low-noise amplifier (LNA) at any point in the receiver path.

The addition of the narrow band filter 802 facilitates the reception of ultra wideband signal pulses and, therefore, extends the Nyquist folding bandpass sampling receiver to allow processing of ultra wideband (UWB) pulses. The UWB pulses that enter the wideband filter 302 will pass through essentially unmodified. Thus, with a high bandwidth RF sampler suitable for direct RF sampling, the sample pulses are relatively narrow and the probability of a UWB pulse being completely missed by the RF sampler can be relatively high. However, any UWB pulse entering the narrow-band filter 802 will be stretched in the time domain. Thus, the RF sampler can capture the UWB pulse particularly if the bandwidth of the narrow-band filter 802 is less than the Nyquist bandwidth of the RF sample rate. It is noted that the bandwidth of the narrow-band filter 802 could be designed to be wider than the Nyquist bandwidth associated with rate of the RF sampling clock; however, the effectiveness of this narrow-band filter 802 for receiving UWB pulses would likely be degraded.

The UWB pulses can be processed using any desired technique. For example, the UWB pulses can then be processed using known processing techniques, such as FRI (Finite Rate of Innovation) techniques, with the modification to the processing to take into account the modulated sample clock. Alternatively, individual UWB pulses can be processed by looking for the impulse response of the narrow-band filter, again taking into account the modulated sample clock and interpolation filter followed by ADC. Still further, the UWB pulses may be processed using known frequency domain processing techniques, such as a modified root MUSIC technique applied to frequency domain information. It is further noted that the narrow-band filter may be designed based on the sampling rate of the RF sampler sample rate, or it may be designed based on the FRI techniques.

It is noted that the parallel narrow-band filter 802 may be tunable, if desired. If tunable, the architecture has the advantage of allowing placement of the narrow band filter 802 in a region of the RF range of interest that is relatively free from noise and interferers. This selected placement can advantageously provide for higher signal to noise ratio (SNR), provide for higher signal to interference ratio (SIR), and/or, more generally, provide for higher signal to interference and noise ratio (SINR). Still further, multiple parallel narrow-band filters may be used, if desired. As such, additional filters would be coupled between the RF input signal and the RF sampling circuitry in parallel with the wideband filter 302. If these additional narrow band filters were configured to have the same impulse response as the first narrow band filter 802, then the impulse responses will coherently add thereby allowing for higher SINR. Thus, if desired, the narrow band filter circuitry can be implemented as one or more tunable narrow band filters each having a tunable center frequency dependent upon a filter control signal and each being tunable across the frequency range of interest.

With respect FIGS. 9A and 9B, an embodiment is now discussed for a Nyquist folded bandpass sampling receiver architecture that combines features from FIG. 1, FIG. 2A and FIG. 3 to form a hybrid receiver architecture.

As described above, the reconfigurable direct RF bandpass sampling receiver of FIG. 1 and FIG. 2A, can use a tunable and/or switchable anti-aliasing filter in conjunction with a tunable and/or switchable RF sampling clock in order to perform reconfigurable bandpass sampling down conversion. Although the analog interpolation filter is not required, it can simplify the hardware design and provide more flexibility in design because it allows the RF sample rate to be completely de-coupled from the ADC sample rate. As also described above, the Nyquist folded bandpass sampling receiver of FIG. 3 allows multiple Nyquist zones to fold on top of each other. Through a modulated sampling clock, separate modulations are induced within each Nyquist zone. When the Nyquist zones fold on top of each other, the different signals can then be separated based on the fact that the added modulation is different for each Nyquist zone and can be identified in the signals. Again, the analog interpolation filter is not required for this architecture, but it can simplify the design and provides further degrees of freedom in the receiver design.

In some cases, it may be difficult to meet the anti-aliasing requirements using a tunable filter for the reconfigurable direct RF bandpass sampling receiver. To overcome this potential problem, the reconfigurable direct RF bandpass sampling receiver can be combined with the Nyquist folded receiver architecture by modulating the tunable RF sampling clock and easing the tunable anti-alias filter requirements so that some aliasing may be allowed. The resulting receiver will have similar functionality as the reconfigurable direct RF receiver with simplified anti-aliasing filter requirements. These simplified requirements provide potential advantages including a reduction in cost, a reduction in insertion loss, improved noise figure, etc. While some Nyquist folding will occur, the Nyquist folding will, depending upon the front-end anti-aliasing filter utilized, be relatively minimal with perhaps only partial fold-over or perhaps only one or two additional Nyquist zones folded in. Thus the signal separation problem will be manageable for a high-dynamic range system compared to a Nyquist folded receiver design with a ultra wideband front-end filter. This architecture is further explained with respect to FIGS. 9A and 9B.

FIG. 9A is a block diagram for a Nyquist folded bandpass sampling receiver having a modulated and possibly tunable sampling clock that combines aspects of FIG. 1, FIG. 2A and FIG. 3. In the embodiment 900, the antenna 202 provides an RF input signal to a front-end filter 302 that is implemented as an ultra wideband (UWB) filter 302 that allows multiple Nyquist zones to be passed through for further processing. As discussed above, the signal is then applied to RF sampler 204 that receives a modulated RF sampling clock signal from clock circuitry 304 that causes different signal modulations in different Nyquist zones. As further discussed above, the modulated RF sampling clock may also be have a tunable frequency, if desired. The output of the RF sampler 204 then passes to the analog interpolation filter 206. The signal is then digitized by ADC 210, which receives a quantization clock signal from ADC clock circuitry 214. Next, the signal is processed by a DSP 902 that is configured to unfold the Nyquist folding caused by the prior processing, as discussed above, and to determine the Nyquist zone from which signals originated.

FIG. 9B is a block diagram for a Nyquist folded bandpass sampling with a tunable and modulated sampling clock and a front-end filter that provides some anti-aliasing. For this embodiment 950 as compared to embodiment 900 in FIG. 9A, the front-end filter has now been implemented as a tunable anti-alias filter 912 that allows more than one Nyquist zone to pass through, but is not as wide as the front-end filter 302 in FIG. 9A. Thus, the front-end filter 912 is configured to allow more aliasing than the front-end filter 104 in FIG. 2A, but is configured to provide more anti-aliasing than the ultra wideband filter 302 in FIG. 3. As depicted, the RF sampling clock circuitry 914 provides an RF sampling clock signal that is both modulated and tunable in frequency. In addition, the DSP 916 is modified from the DSP that would process signals from the ADC 210 in FIG. 2A, so that it allows for some unfolding of the Nyquist zones, as does the DSP 902 in FIG. 9A.

As discussed above, the architecture of FIG. 9B is different from the embodiments of FIG. 1 and FIG. 2A in that the front-end filter is configured to allow aliasing (and limited Nyquist fold-over) in order to reduce the requirements on a front-end tunable anti-aliasing filter. In contrast with the Nyquist folded receiver of FIG. 3, the front-end filter 912 is a tunable anti-aliasing filter rather than a wide-open fixed ultra wideband (UWB) filter. This anti-aliasing filter 912, however, does allow some amount of aliasing. The resulting performance of the embodiment 950 will be more similar to the reconfigurable direct RF bandpass sampling receiver of FIG. 1 than the Nyquist folded receiver of FIG. 3 both in bandwidth and dynamic range. While the Nyquist folded receiver might have a tunable as well as modulated clock, the purpose of the tuning is to shift across many Nyquist zones simultaneously as opposed to avoiding or centering between Nyquist fold-over points. It is noted that other variations and implementations could also be provided to and utilized with this architecture, if desired.

Figure 10A:
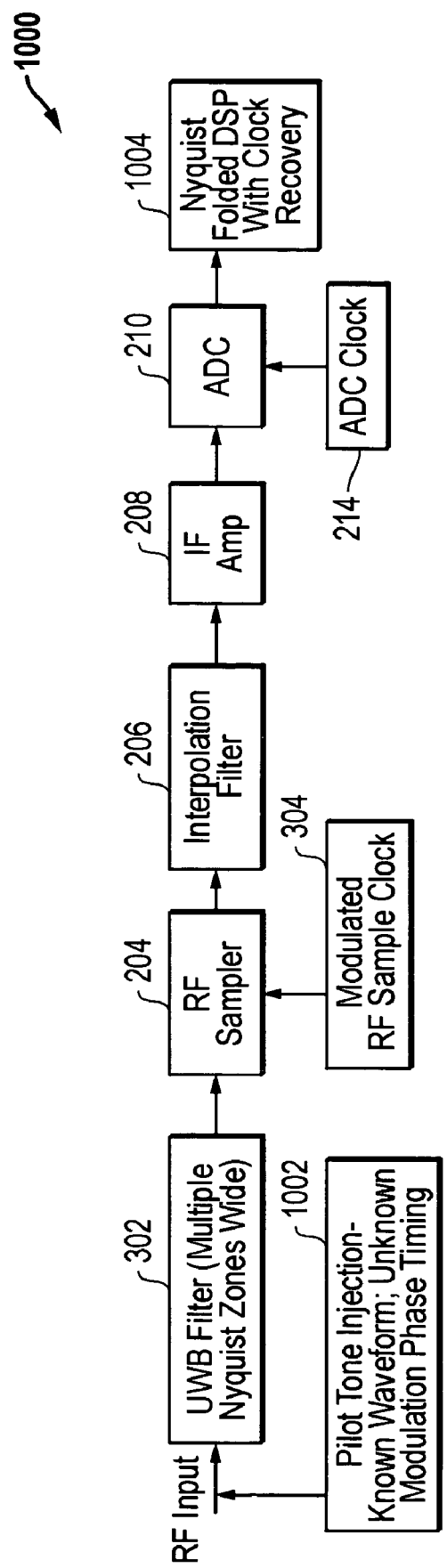
FIG. 10A is a block diagram for a Nyquist folded bandpass sampling receiver utilizing an injected pilot tone to facilitate clock recovery.
Figure 10B:
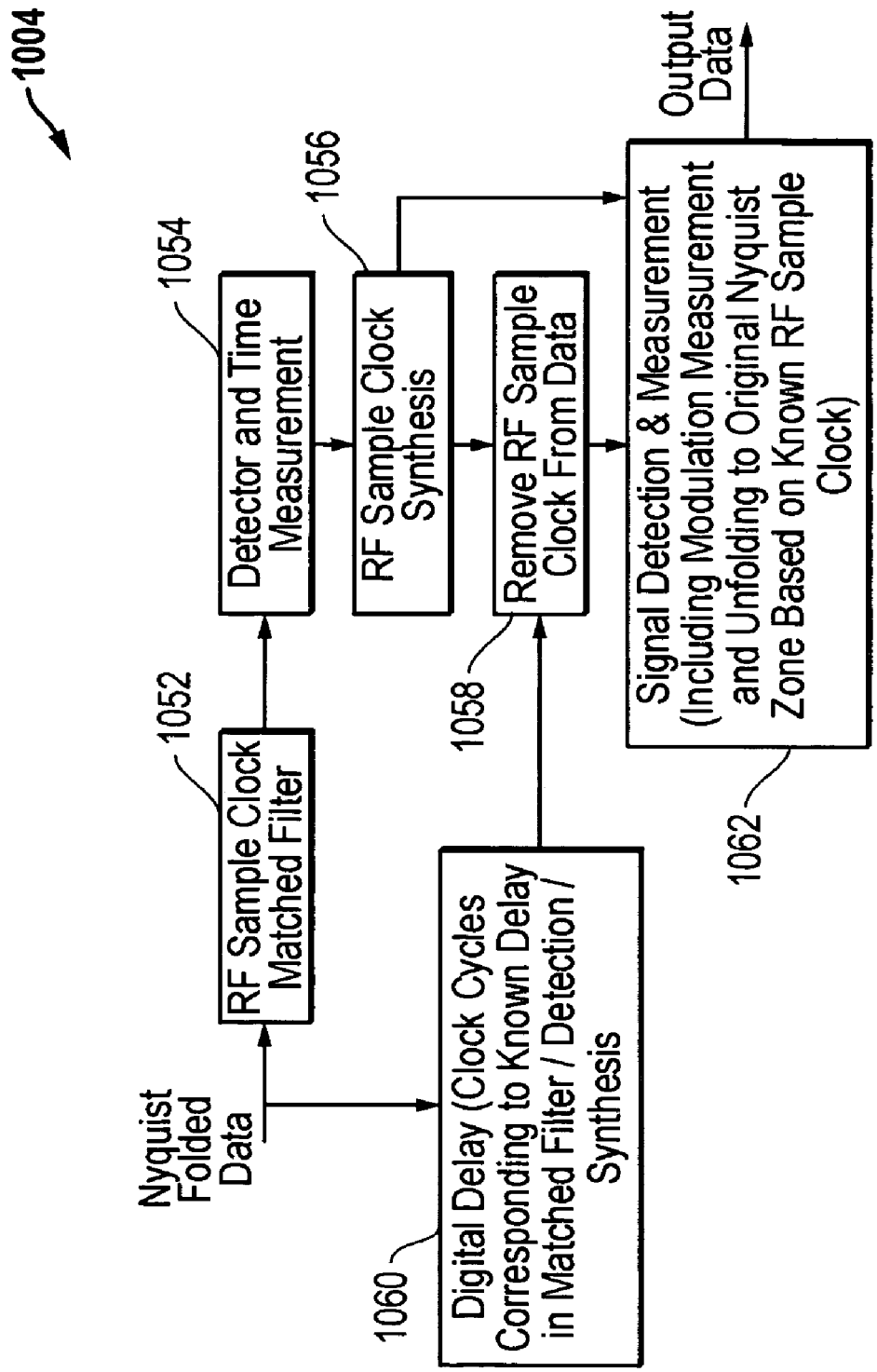
FIG. 10B is a block diagram for example processing that could be used to recover the clock signal and analyze the signal data.

With respect to FIGS. 10A and 10B, an embodiment is discussed for using an injected pilot tone in order to facilitate the recovery of the modulated sample clock. This approach to recover the clock signal requires less hardware than a separate clock synchronization circuit, as well as allowing for a more precise alignment of the RF sampling clock, because the sampling clock modulation is induced on the pilot tone waveform and included with the sampled output data.

FIG. 10A is a block diagram for a Nyquist folded bandpass sampling receiver 1000 utilizing an injected pilot tone to facilitate clock recovery. The receiver architecture depicted is similar to embodiment 300 of FIG. 3. A front-end filter 302 is implemented as a ultra wideband (UWB) filter that is multiple Nyquist zones wide to allow multiple Nyquist zones to pass through. An RF sampler 204 then samples the signals using a modulated RF sampling clock signal from clock circuitry 304. The sampled signals are then provided to an analog interpolation filter 206, to an intermediate frequency amplifier (IF Amp) 208, and to an ADC 210. The ADC 210 receives a quantization clock signal from ADC clock circuitry 214. In contrast to FIG. 3, the embodiment 1000 includes pilot tone injection circuitry 1002 configured to inject a pilot tone into the system such that it is combined with the RF input going to the front-end filter 302. The pilot tone can be, for example, a signal of known waveform having unknown modulation phase timing. Other injected signals may also be used, if desired. The DSP circuitry 1004 is further configured to provide Nyquist folded processing to unfold the folded Nyquist zones. In addition, the DSP circuitry 1004 is further configured to recover the sampling clock signal utilizing the pilot tone injected into the RF input.

FIG. 10B is a block diagram for example processing for DSP 1004 that could be used to recover the clock signal and analyze the signal data. As shown, the quantized Nyquist folded data is processed through two paths. One path is a delay path. The other path detects the sampling clock and then provides it back to the delayed path. In particular, the quantized Nyquist folded data is provided to filter 1052 which is configured to be a matched digital filter that passes the RF sampling clock frequency. The output of filter 1052 is then provided to detector and time measurement block 1054 and then to RF sample clock synthesis block 1056 before being provided to block 1058. The quantized Nyquist folded data is also provided to digital delay block 1060 where the data signal is delayed by a number of clock cycles corresponding to known delays in the matched filter 1052, the detection processing in block 1054 and the synthesis processing in block 1056. The output of the digital delay block 1060 is provided to processing block 1058 where the RF sampling clock signal is removed from the data signal. The output of block 1058 is then provided to block 1062 for signal detection and measurement. Block 1062 also receives the synthesized clock signal from block 1056. In operation, block 1062 processes the data signal including performing modulation measurement and unfolding to the original Nyquist zone based on the known and recovered RF sampling clock. Block 1062 then outputs data related to the recovered signals.

In operation, a known pilot tone can be injected into a first Nyquist zone before the RF sampler 204, as shown in FIG. 10A. Because the induced modulation in Nyquist zone X will have a ceiling (X/2) scale factor on the RF sample clock modulation, the pilot tone injected into the first will have an induced modulation exactly equal in amplitude to the modulated sample clock. Because the modulated sample clock waveform is known, a matched filter can be designed to detect the modulated sample clock. Once detected, the exact time reference of the modulated sample clock can be measured. Because the modulated sample clock is now embedded in the data, the measured modulated clock time reference is automatically relative to the incoming RF data. For example, the modulated RF sampling clock can be a triangular waveform that is frequency modulated from 2000 to 2010 Gsps with a period of 20 µsec. The injected pilot tone can be a continuous wave un-modulated tone at 2.155 GHz. In this particular example, therefore, the pilot tone is injected into the second Nyquist zone. Thus, the induced frequency modulation after Nyquist folding will equal the clock. It is noted that the known injected tone may be selected, as desired, for injection into the signal path. As indicated above, the injected tone may be a continuous wave tone. It can also be an arbitrary waveform signal or any other desired injected tone.

FIG. 10B shows one approach to analyzing the signal data. As depicted, matched filtering is performed on the incoming RF sampled data using a matched filter 1052 based on the known RF sampling clock modulation. Then, when the RF sampling clock is detected in block 1054, the associated time reference can be used to replicate the RF sample clock modulation in block 1056, which is then subtracted from the input data in block 1058 and which is also used for determination of the original Nyquist zone of any remaining signals in the data in block 1062. It is also noted that a priori information can also be applied for an improved estimate of the originating Nyquist zone.

The recovery of the modulated clock signal provided by the example embodiments of FIG. 10A and FIG. 10B is advantageous. If the modulated RF sampling clock is known exactly (e.g., waveform shape and time reference), then more flexible modulation clocks may be used without inducing ambiguity. For example, a linear frequency modulated (FM) sweep may be used without knowing the time reference because the slope is constant (except for the sweep repeats). With a sinusoidal FM modulation, it is difficult to tell from which Nyquist zone a signal comes without knowing the instantaneous slope of RF sampling clock frequency modulation at that time. By recovering the modulated clock signal, this ambiguity can be resolved.

Thus, the embodiments of FIG. 10A and FIG. 10B allow for increased flexibility in the selection of clock modulations, and this ability to utilize a wider range of clock modulations provides advantages. In part, this flexibility allows for a wider range of signals to be processed successfully and allows for increased flexibility in programming the modulation of the clock in order to make system harder to defeat by counter measures. For example, a pulse with some linear frequency modulation will be difficult to distinguish from a pulse in a higher Nyquist zone with induced linear frequency modulation if the RF sampling clock modulation is a linear frequency modulation. However, if the RF sampling clock modulation is triangle waveform, for example, only a triangle modulation waveform that was time-aligned with the RF sampling clock would result in ambiguity (other than specially designed asymmetrical triangle modulation waveforms). If the RF sampling clock modulation is alternated or adjusted over time during operation of the communication system, then no standard waveform would result in ambiguity. Another benefit is that the RF sampling clock modulation does not have to be tightly controlled because clock can be measured rather than simply relying upon the expected clock signal.

Is noted that other clock synchronization circuitry could also be used. For example, another approach to acquire knowledge of the clock from the data signal could be to include an electronic synchronization circuit to accurately synchronize the RF sampling clock modulation with associated time stamping or referencing to the RF input data. This approach could be done for the Nyquist folded receiver, but this approach would require some additional hardware and would be susceptible to problems from time delay variations. The technique in FIG. 10A and FIG. 10B does not require synchronization hardware, although an alternative embodiment could be to use a synchronization circuit, resulting in a more complex hardware system, possible calibration difficulties, and simpler digital signal processing in the DSP. Other variations could also be implemented, if desired.

Further modifications and alternative embodiments of this invention will be apparent to those skilled in the art in view of this description. It will be recognized, therefore, that the present invention is not limited by these example arrangements. Accordingly, this description is to be construed as illustrative only and is for the purpose of teaching those skilled in the art the manner of carrying out the invention. It is to be understood that the forms of the invention herein shown and described are to be taken as the presently preferred embodiments. Various changes may be made in the implementations and architectures. For example, equivalent elements may be substituted for those illustrated and described herein, and certain features of the invention may be utilized independently of the use of other features, all as would be apparent to one skilled in the art after having the benefit of this description of the invention.

What is claimed is:

1. Receive path circuitry for a bandpass sampling receiver having folded Nyquist zones and ultra wideband pulse capabilities, comprising:

wideband filter circuitry receiving an RF input signal, having a center frequency within a frequency range of interest and having a bandwidth less than or equal to the frequency range of interest and wide enough to cover multiple Nyquist zones associated with a modulated sampling clock;

narrow band filter circuitry receiving the RF input signal and having a center frequency within a frequency range of interest and having a bandwidth less than the Nyquist bandwidth of the modulated sampling clock; and sampling circuitry configured to receive a filtered signal from the wideband filter circuitry, to receive a filtered signal from the narrow band filter circuitry, and to receive the modulated sampling clock signal as an input, the modulated sampling clock signal being configured to provide non-uniform sampling for signals within the multiple Nyquist zones.

2. The receive path circuitry of claim 1, wherein the modulated sampling clock signal comprises a frequency modulated clock signal.

3. The receive path circuitry of claim 2, wherein the frequency modulated clock signal comprises a linear sawtooth modulation, a sinusoidal modulation, a triangle modulation, a frequency shift key modulation, a frequency agile modulation, a communications frequency modulation, or a combination thereof.

4. The receive path circuitry of claim 2, wherein the sampling circuitry comprises:

non-quantizing sampling circuitry;

an analog interpolation filter coupled to receive the output of the non-quantizing sampling circuitry, the analog interpolation filter having a center frequency within a Nyquist zone of operation for the non-quantizing sampling circuitry; and analog to digital converter (ADC) circuitry configured to receive a quantization sampling clock signal and to quantize an analog signal received from the analog interpolation filter.

5. The receive path circuitry of claim 4, wherein the analog interpolation filter comprises a tunable or switchable interpolation filter.

6. The receiver path circuitry of claim 1, wherein the modulated sampling clock comprises a frequency modulated sampling clock having a tunable frequency or an adjustable modulation or both.

7. The receive path circuitry of claim 1, wherein the wideband filter circuitry comprises a wideband filter having bandwidth of 10 GHz or more, the modulated sampling clock has a sampling rate of 1 GHz or more, and the narrow band filter circuitry comprises a bandwidth less than 1 GHz.

8. The receive path circuitry of claim 1, wherein the wideband filter circuitry comprises a wideband filter having bandwidth of 20 GHz or more, the modulated sampling clock has a sampling rate of 2 GHz or more, and the narrow band filter circuitry comprises a bandwidth less than 2 GHz.

9. The receive path circuitry of claim 1, wherein the wideband filter circuitry comprises a tunable bandpass filter having a tunable center frequency dependent upon a filter control signal, the center frequency being tunable across the frequency range of interest, and the tunable bandpass filter having a bandwidth less than the frequency range of interest.

10. The receive path circuitry of claim 1, wherein the narrow band filter circuitry comprises one or more tunable narrow band filters each having a tunable center frequency dependent upon a filter control signal and each being tunable across the frequency range of interest.

11. The receive path circuitry of claim 1, further comprising digital signal processing circuitry coupled to receive an output from the sampling circuitry and configured to identify ultra wideband pulses based upon signals passed through the narrow band filter circuitry.

12. A method for bandpass sampling of signals using folded Nyquist zones, comprising:

utilizing wideband filter circuitry to filter an RF input signal within a frequency range of interest, the bandpass filter having a bandwidth less than or equal to the frequency range of interest and wide enough to cover multiple Nyquist zones associated with a modulated sampling clock;

also filtering the RF input signal with narrow band filter circuitry having a center frequency within a frequency range of interest and having a bandwidth less than the Nyquist bandwidth of the modulated sampling clock;

combining an output signal from the wideband filter circuitry with an output signal from the narrow band filter circuitry to generate a combined filtered signal;

generating a modulated sampling clock configured to provide non-uniform sampling for signals within the multiple Nyquist zones; and bandpass sampling the combined filtered signal from the wideband filter circuitry covering multiple Nyquist zones using the modulated sampling clock.

13. The method of claim 12, wherein the generating step comprises generating a chirp frequency modulated clock signal for the modulated sampling clock signal.

14. The method of claim 12, wherein the bandpass sampling step comprises:

bandpass sampling the combined filtered signal without quantizing the signal;

filtering the sampled signal with an analog interpolation filter having a center frequency within a Nyquist zone; and quantizing a signal received from the analog interpolation filter.

15. The method of claim 14, wherein the generating step comprises generating a frequency modulated clock signal for the modulated sampling clock signal.

16. The method of claim 14, further comprising using a tunable or switchable interpolation filter as the analog interpolation filter.

17. The method of claim 12, wherein the utilizing step comprises utilizing wideband filter circuitry having a bandwidth of 10 GHz or more, wherein the generating step comprises generating a modulated sampling clock signal having a sampling rate of 1 GHz or more, and wherein the filtering step comprises filtering with narrow band filter circuitry having a bandwidth less than 1 GHz.

18. The method of claim 12, wherein the utilizing step comprises utilizing wideband filter circuitry having a bandwidth of 20 GHz or more, wherein the generating step comprises generating a modulated sampling clock signal having a sampling rate of 2 GHz or more, and wherein the filtering step comprises filtering with narrow band filter circuitry having a bandwidth less than 2 GHz.

19. The, method of claim 12, wherein the utilizing step comprises utilizing one or more tunable bandpass filters and further comprising tuning the center frequency of the tunable bandpass filter within the frequency range of interest.

20. The method of claim 12, wherein the filtering step comprises filtering the RF input signal with one or more tunable narrow band filters and further comprising tuning the center frequency of the one or more tunable narrow band filters within the frequency range of interest.

21. The method of claim 12, further comprising processing sampled signals to identify ultra wideband pulses based upon signals passed through the narrow band filter circuitry.

* * * * *